United States Patent
Sugawara et al.

(10) Patent No.: US 10,153,803 B2
(45) Date of Patent: Dec. 11, 2018

(54) RECEIVING CIRCUIT, WIRELESS COMMUNICATION MODULE, AND WIRELESS COMMUNICATION DEVICE

(71) Applicant: KABUSHIKI KAISHA TOSHIBA, Tokyo (JP)

(72) Inventors: Mitsuru Sugawara, Yokohama Kanagawa (JP); Toshiki Seshita, Kawasaki Kanagawa (JP); Yasuhiko Kuriyama, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/448,281

(22) Filed: Mar. 2, 2017

(65) Prior Publication Data

US 2018/0083665 A1   Mar. 22, 2018

(30) Foreign Application Priority Data

Sep. 20, 2016   (JP) .................. 2016-183338

(51) Int. Cl.
*H04B 1/44* (2006.01)
*H03H 7/38* (2006.01)
*H04B 1/18* (2006.01)
*H04B 1/04* (2006.01)

(52) U.S. Cl.
CPC .............. *H04B 1/44* (2013.01); *H03H 7/38* (2013.01); *H04B 1/18* (2013.01); *H04B 2001/0408* (2013.01)

(58) Field of Classification Search
None
See application file for complete search history.

(56) References Cited

U.S. PATENT DOCUMENTS

| 5,784,687 | A | 7/1998 | Itoh et al. |
| 8,803,632 | B2 | 8/2014 | Takeuchi |
| 2015/0318889 | A1* | 11/2015 | Lee .................. H04B 1/44 |
| | | | 455/78 |
| 2016/0056774 | A1* | 2/2016 | Ilkov .............. H03F 1/565 |
| | | | 330/251 |

(Continued)

FOREIGN PATENT DOCUMENTS

| JP | 2801563 | 9/1998 |
| JP | 2000-294786 | 10/2000 |

(Continued)

OTHER PUBLICATIONS

N. Srirattana, "SP10T Switch Routes 2G/3G/4G Signals", Microwaves and RF, Jan. 2011.

*Primary Examiner* — Alejandro Rivero
(74) *Attorney, Agent, or Firm* — Patterson & Sheridan, LLP

(57) ABSTRACT

A receiving circuit includes a plurality input nodes to receive an input signals and an output node to output a signal corresponding to the input signal. An amplifier in the circuit has an input terminal and an output terminal. A first switch selectively connects one of the input nodes to the input terminal of the amplifier. A second switch selectively connects the one of the input nodes to the output node. A controller supplies control signals to the first switch and the second switch. An impedance matching section is connected between the input nodes and the amplifier.

17 Claims, 15 Drawing Sheets

(56) References Cited

U.S. PATENT DOCUMENTS

2017/0026010 A1* 1/2017 Oshita .................... H03F 1/565
2017/0033786 A1* 2/2017 Prevost ................ H03K 17/165

FOREIGN PATENT DOCUMENTS

| JP | 5648901 | 1/2015 |
| JP | 5879547 | 3/2016 |
| WO | 2010053131 | 5/2010 |

* cited by examiner

FIG. 6A

| OPERATION MODE (Msel) | SW1 | SW2 |
|---|---|---|
| GAIN MODE | PASSING | NON-PASSING |
| BYPASS MODE | NON-PASSING | PASSING |

FIG. 6B

| STATES OF SW1 AND SW2 | SELECTED/NON-SELECTED INPUT PORT (Psel) | THROUGH-ELEMENT GROUP (THROUGH-FETs) |
|---|---|---|
| PASSING | SELECTED PORT | ON |
| PASSING | NON-SELECTED PORT | OFF |
| NON-PASSING | SELECTED PORT | OFF |
| NON-PASSING | NON-SELECTED PORT | OFF |

| OPERATION MODE (Msel) | T1 ~ Tp | S1 ~ Sq |
|---|---|---|
| GAIN MODE | ON | OFF |
| BYPASS MODE | OFF | ON |

| OPERATION MODE (Msel) | SW1 | SW2 |
|---|---|---|
| GAIN MODE | PASSING | NON-PASSING |
| BYPASS MODE | NON-PASSING | PASSING |

FIG. 14B

| STATES OF SW1 AND SW2 | SELECTED/NON-SELECTED INPUT PORT (Psel) | THROUGH-ELEMENT GROUP (THROUGH-FETs) | SHUNT ELEMENT GROUP (SHUNT FETs) |
|---|---|---|---|
| PASSING | SELECTED PORT | ON | OFF |
| | NON-SELECTED PORT | OFF | ON |
| NON-PASSING | SELECTED PORT | OFF | ON |
| | NON-SELECTED PORT | | |

FIG. 16A

| OPERATION MODE (Msel) | SW1 | SW2 |
|---|---|---|
| GAIN MODE | PASSING | NON-PASSING |
| BYPASS MODE | NON-PASSING | PASSING |

FIG. 16B

| STATES OF SW1 AND SW2 | SELECTED/NON-SELECTED INPUT PORT (Psel) | THROUGH-ELEMENT GROUP (THROUGH-FETs) | SHUNT ELEMENT GROUP (SHUNT FETs) |
|---|---|---|---|
| PASSING | SELECTED PORT | ON | OFF |
| | NON-SELECTED PORT | OFF | |
| NON-PASSING | SELECTED PORT | OFF | ON |
| | NON-SELECTED PORT | | |

FIG. 18A

| OPERATION MODE (Msel) | SW1 | SW2 |
|---|---|---|
| GAIN MODE | PASSING | NON-PASSING |
| BYPASS MODE | NON-PASSING | PASSING |

FIG. 18B

| STATES OF SW1 AND SW2 | SELECTED/NON-SELECTED INPUT PORT (Psel) | THROUGH-ELEMENT GROUP (THROUGH-FETs) | SHUNT ELEMENT GROUP (SHUNT FETs) |
|---|---|---|---|
| PASSING | SELECTED PORT | ON | OFF |
| PASSING | NON-SELECTED PORT | OFF | ON |
| NON-PASSING | SELECTED PORT | OFF | OFF |
| NON-PASSING | NON-SELECTED PORT | OFF | ON |

RECEIVING CIRCUIT, WIRELESS COMMUNICATION MODULE, AND WIRELESS COMMUNICATION DEVICE

CROSS-REFERENCE TO RELATED APPLICATION

This application is based upon and claims the benefit of priority from Japanese Patent Application No. 2016-183338, filed Sep. 20, 2016, the entire contents of which are incorporated herein by reference.

FIELD

Embodiments described herein relate generally to receiving circuits, wireless communication modules, and wireless communication devices.

BACKGROUND

A mobile communication device includes a receiving circuit having a low-noise amplifier (LNA) so that good receiving characteristics can be obtained even when a received signal is weak. In this LNA, a bypass switch is sometimes provided so as to change the signal gain. In general, the bypass switch is connected in parallel with an amplifier part of the LNA and thus provides a bypass route between input and output terminals of the amplifier part.

However, since the input impedance of the field-effect transistor (FET) used for the amplification in the LNA is typically very high, the input impedance of the receiving circuit increases when the bypass switch is off. On the other hand, when the bypass switch is turned on, the bypass switch connects between input and output terminals, whereby the input impedance of the receiving circuit decreases. Therefore, depending on the state of the bypass switch, a large difference can be caused in the input impedance of the receiving circuit. In such a case, the input impedance of the receiving circuit might not be appropriately matched to the characteristic impedance of the system including the receiving circuit. As a result, good receiving characteristics cannot be obtained with this receiving circuit.

DESCRIPTION OF THE DRAWINGS

FIGS. 6A and 6B are tables for explaining the operations of the first and second switch circuits.

FIGS. 14A and 14B are tables for explaining the operations of the first and second switch circuits according to the fifth embodiment.

FIGS. 16A and 16B are tables for explaining the operations of the first and second switch circuits according to the sixth embodiment.

FIGS. 18A and 18B are tables for explaining the operations of the first and second switch circuits according to the seventh embodiment.

DETAILED DESCRIPTION

According to one embodiment, a receiving circuit includes a plurality of input nodes at which an input signal can be received and an output node at which an output signal corresponding to the input signal can be output. An amplifier in the receiving circuit has an input terminal and an output terminal. A first switch is configured to selectively connect one of the input nodes in the plurality of input nodes to the input terminal of the amplifier. A second switch is configured to selectively connect the one of the input nodes in the plurality of input nodes to the output node. A controller is configured to supply control signals to the first switch, the second switch, and the amplifier according to a port selection control signal and a mode selection control signal. An impedance matching section can be connected between the plurality of input nodes and the amplifier.

Hereinafter, example embodiments will be described with reference to the drawings. These example embodiments are presented to explain aspects of the present disclosure. The present disclosure is not limited to the examples presented.

First Embodiment

Figure 1:
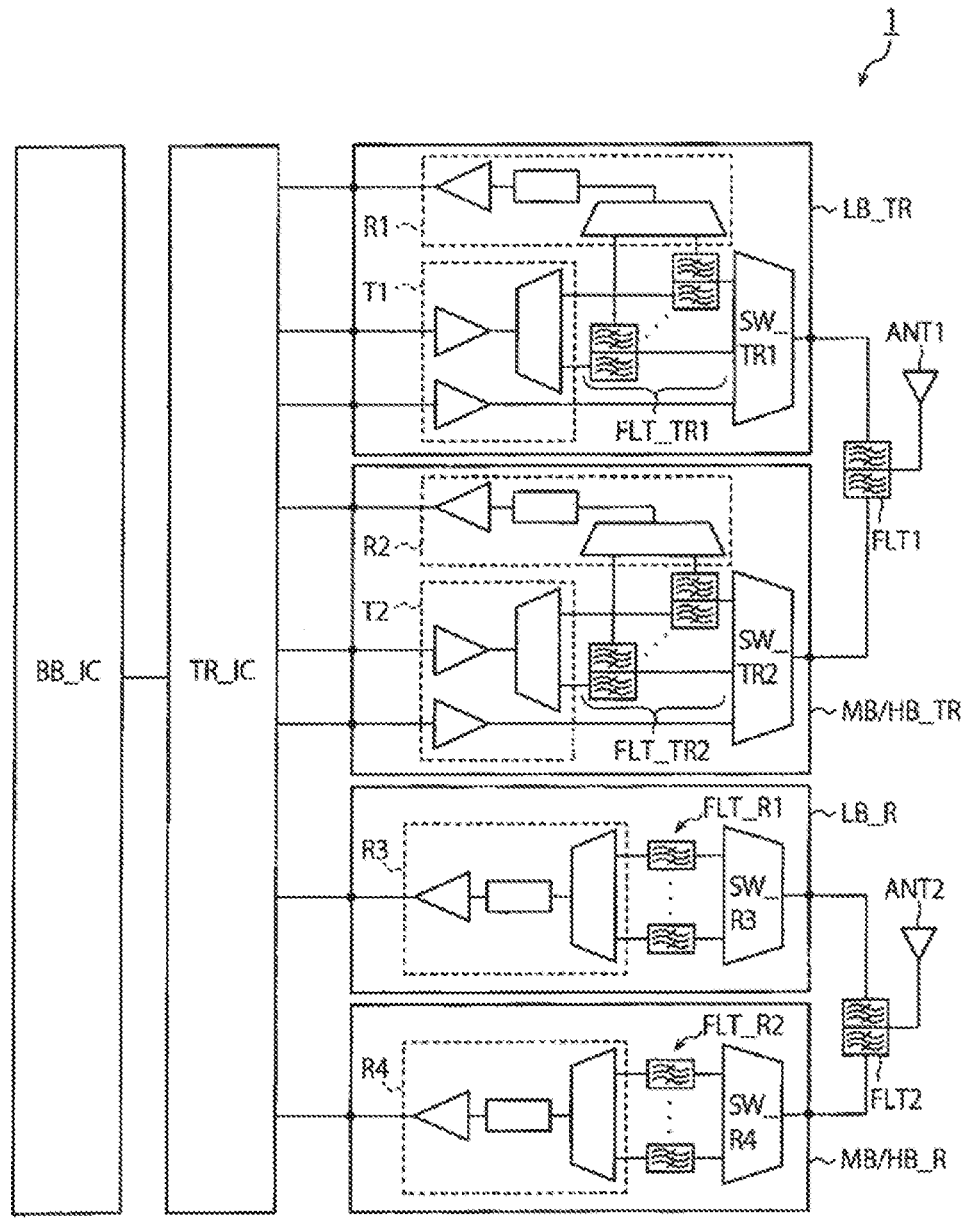
FIG. 1 is a diagram showing a configuration example of a transmitting and receiving portion of a communication device according to a first embodiment.

FIG. 1 is a diagram showing a configuration example of a transmitting and receiving portion of a communication device 1 according to a first embodiment. The communication device 1 is an electrical apparatus that transmits and receives a radio frequency (RF) signal and may be applied to, for example, mobile communication terminals, such as a mobile phone, a smartphone, a wireless tablet, a wireless router, a wireless base station, or a wireless access point.

The transmitting and receiving portion of the communication device 1 according to the present embodiment includes a first antenna ANT1, a second antenna ANT2, filter circuits FLT1 and FLT2 (also referred to as diplexers (DIPs)), a low-frequency band transmitting and receiving circuit LB_TR, a mid-to-high-frequency band transmitting and receiving circuit MB/HB_TR, a low-frequency band receiving circuit LB_R, a mid-to-high-frequency band receiving circuit MB/HB_R, a transceiver circuit TR_IC, and a baseband circuit BB_IC.

The antenna ANT1 is a primary antenna that transmits and receives a RF signal. The filter circuit FLT1 is connected to the antenna ANT1 and demultiplexes the received signal received by the antenna ANT1 into a low-frequency band received signal and a mid-to-high-frequency band received signal or multiplexes a low-frequency band transmitted signal and a mid-to-high-frequency band transmitted signal which are transmitted from the antenna ANT1.

The low-frequency band transmitting and receiving circuit LB_TR is connected between the filter circuit FLT1 and the transceiver circuit TR_IC and includes a receiving circuit R1 and a transmitting circuit T1. The receiving circuit R1 performs switching and amplification of a received signal from the filter circuit FLT1 in a low-frequency band (for example, a band lower than 1 GHz) via a switch circuit SW_TR1 and a filter circuit FLT_TR1 and outputs the resultant signal to the transceiver circuit TR_IC. The transmitting circuit T1 performs, via the filter circuit FLT_TR1 and the switch circuit SW_TR1, amplification and switching of a transmitted signal in the low-frequency band which has been output from the transceiver circuit TR_IC and then outputs the resultant signal to the filter circuit FLT1.

The mid-to-high-frequency band transmitting and receiving circuit MB/HB_TR is connected between the filter circuit FLT1 and the transceiver circuit TR_IC and includes a receiving circuit R2 and a transmitting circuit T2. The receiving circuit R2 performs switching and amplification of a received signal from the filter circuit FLT1 in a mid-to-high frequency band (for example, a 1 to 3 GHz band) via a switch circuit SW_TR2 and a filter circuit FLT_TR2 and outputs the resultant signal to the transceiver circuit TR_IC. The transmitting circuit T2 performs, via the filter circuit FLT_TR2 and the switch circuit SW_TR2, amplification and switching of a transmitted signal in the mid-to-high frequency band which has been output from the transceiver circuit TR_IC and then outputs the resultant signal to the filter circuit FLT1.

The antenna ANT2 is a secondary antenna that may receive a RF signal. The filter circuit FLT2 is connected to the antenna ANT2 and demultiplexes the signal received by the antenna ANT2 into a low-frequency band received signal and a mid-to-high-frequency band received signal.

The low-frequency band receiving circuit LB_R is connected between the filter circuit FLT2 and the transceiver circuit TR_IC and includes a receiving circuit R3. The receiving circuit R3 performs switching and amplification of a received signal in the low-frequency band from the filter circuit FLT2 via a switch circuit SW_R3 and a filter circuit FLT_R3 and then outputs the resultant signal to the transceiver circuit TR_IC.

The mid-to-high-frequency band receiving circuit MB/HB_R is connected between the filter circuit FLT2 and the transceiver circuit TR_IC and includes a receiving circuit R4. The receiving circuit R4 performs switching and amplification of a received signal in the mid-to-high frequency band from the filter circuit FLT2 via a switch circuit SW_R4 and a filter circuit FLT_R4 and outputs the resultant signal to the transceiver circuit TR_IC.

The transceiver circuit TR_IC and the baseband circuit BB_IC receive the received signals and demodulate the received signals into a baseband signal or modulate a baseband signal into a transmitted signal as required.

With the low-frequency band transmitting and receiving circuit LB_TR and the mid-to-high-frequency band transmitting and receiving circuit MB/HB_TR, the communication device 1 can transmit and receive signals in a plurality of frequency bands at the same time through the antenna ANT1. With the low-frequency band receiving circuit LB_R and the mid-to-high-frequency band receiving circuit MB/HB_R, the communication device 1 can also receive signals in a plurality of frequency bands at the same time through the antenna ANT2. That is, the communication device 1 has a so-called "carrier aggregation function." Moreover, the communication device 1 can include a plurality of antennas ANT1 and ANT2 and thereby can perform reception by using the multiple-input and multiple-output (MIMO) function.

Figure 2:
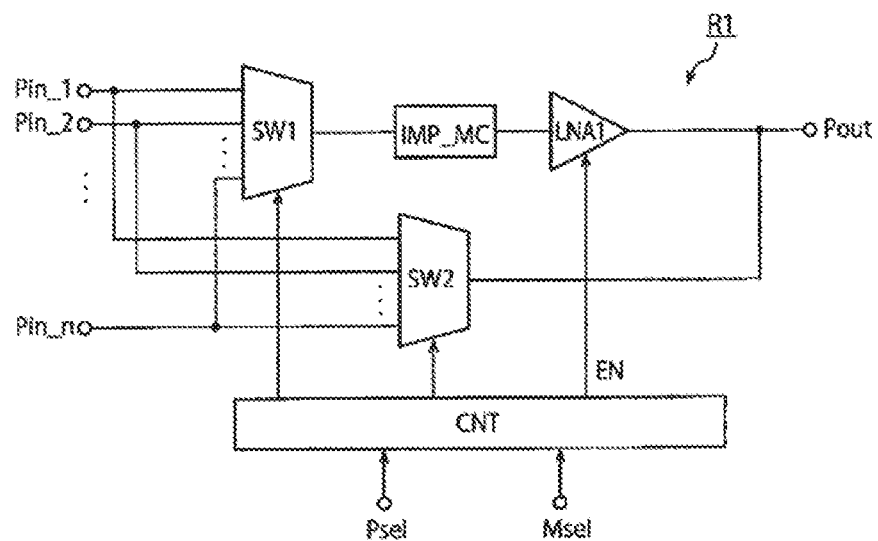
FIG. 2 is a diagram showing the configuration of a receiving circuit.

FIG. 2 is a diagram showing the configuration of the receiving circuit R1. The configurations of the receiving circuits R2 to R4 may be substantially similar to the configuration of the receiving circuit R1. Therefore, only the configuration of the receiving circuit R1 will be explained here and the explanations of the configurations of the receiving circuits R2 to R4 will be omitted.

The receiving circuit R1 includes an amplifier LNA1, a first switch circuit SW1, a second switch circuit SW2, a control circuit CNT, an impedance matching circuit IMP_MC, a plurality of input ports Pin_1 to Pin_n (where n is an integer greater than or equal to 2), and an output port Pout.

The amplifier LNA1 is a low-noise amplification circuit that amplifies a received signal from any one of the plurality of input ports Pin_1 to Pin_n (input portions) by predetermined gain (for example, about 15 dB) and outputs the resultant signal to the output port Pout. The amplifier LNA1 is turned ON or OFF in accordance with a mode selection signal Msel. For example, as will be described later, in a gain mode in which an amplification operation of a received signal is executed, the amplifier LNA1 enters an ON state according to mode selection signal Msel. In a bypass mode in which the received signal is output without being amplified, the amplifier LNA1 enters an OFF state according to mode selection signal Msel.

The first switch circuit SW1 (first switch portion) is provided between the plurality of input ports Pin_1 to Pin_n and the amplifier LNA1 and operates to connect any one of the plurality of input ports Pin_1 to Pin_n to the amplifier LNA1 through the impedance matching circuit IMP_MC. That is, the first switch circuit SW1 is a so-called single-pole n-throw (SPnT) switch circuit. For example, in the gain mode, the first switch circuit SW1 transmits the signal input via any one of the plurality of input ports Pin_1 to Pin_n to the amplifier LNA1 through the impedance matching circuit IMP_MC. This signal is amplified by the amplifier LNA1 and then output from the output port Pout.

Figure 4A:
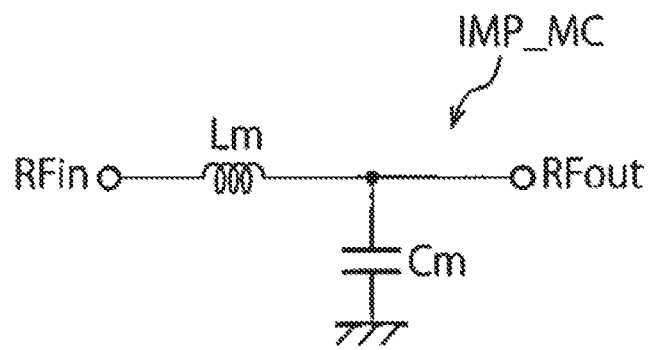
FIGS. 4A to 4C show a configuration example of an impedance matching circuit respectively.
Figure 4B:
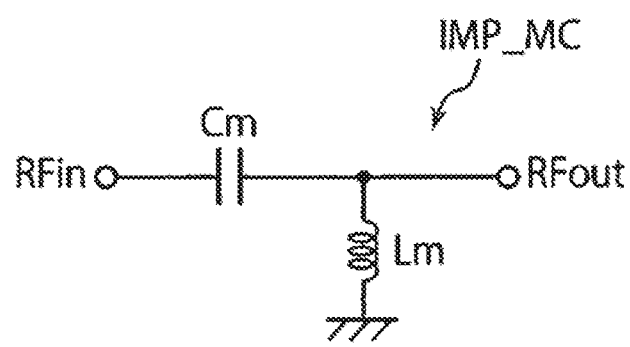

The impedance matching circuit IMP_MC (impedance matching portion) is provided between the first switch circuit SW1 and the amplifier LNA1 and is, for example, an LC circuit formed of an inductor element and a capacitor element (as shown in FIGS. 4A and 4B). The impedance matching circuit IMP_MC is provided to match the input impedance of the receiving circuit R1 to a predetermined impedance (for example, 50Ω). The impedance matching circuit IMP_MC may be provided on the same semiconductor chip as the amplifier LNA1 and the switch circuits SW1 and SW2 or may be provided as an external element separate from chip(s) including the amplifier LNA1 and the switch circuits SW1 and SW2 (see FIG. 19). In the first embodiment, the impedance matching circuit IMP_MC is assumed to be provided on the same semiconductor chip as the amplifier LNA1 and the switch circuits SW1 and SW2. In some embodiments, the impedance matching circuit IMP_MC may be provided between the input ports Pin_1 to Pin_n and the first switch circuit SW1 rather than between the first switch circuit SW1 and the amplifier LNA1.

The second switch circuit SW2 (second switch portion) is provided between the plurality of input ports Pin_1 to Pin_n and the output port Pout. The impedance matching circuit IMP_MC and the amplifier LNA1 are not connected between the output port Pout and the second switch circuit SW2 (nor between the second switch circuit SW2 and the input ports Pin_1 to Pin_n). The second switch circuit SW2 connects any one of the plurality of input ports Pin_1 to Pin_n to the output port Pout. That is, the second switch circuit SW2 is also a so-called SPnT switch circuit. For example, in the bypass mode, the second switch circuit SW2 supplies the received signal from any one of the plurality of input ports Pin_1 to Pin_n directly to the output port Pout, thus bypassing the impedance match circuit IMP_MC and the amplifier LNA1. Thus, the signal is output from the output port Pout without being amplified. As described above, the second switch circuit SW2 functions as a bypass switch.

The control circuit CNT (control portion) receives a port selection signal Psel and a mode selection signal Msel from outside of receiving circuit R1 and controls the switch circuits SW1 and SW2 and the amplifier LNA1 based on the port selection signal Psel and the mode selection signal Msel. For example, if the port selection signal Psel designates the input port Pin_1 and the mode selection signal Msel designates the gain mode, the control circuit CNT controls the first switch circuit SW1 turn a switch corresponding to the input port Pin_1 into an ON state (a conducting state) and brings other switches of the first switch circuit SW1 corresponding to the other input ports Pin_2 to Pin_n into an OFF state (a non-conducting state). Also, at this time, the control circuit CNT drives (powers) the amplifier LNA1 and brings the switches of the second switch circuit SW2 corresponding to all the input ports Pin_1 to Pin_n into an OFF state. On the other hand, for example, if the port selection signal Psel designates the input port Pin_1 and the mode selection signal Msel designates the bypass mode, the control circuit CNT brings a switch of the second switch circuit SW2 corresponding to the input port Pin_1 into an ON state and brings switches of the second switch circuit SW2 corresponding to the input ports Pin_2 to Pin_n into an OFF state. At this time, the control circuit CNT stops driving the amplifier LNA1 and brings all switches of the first switch circuit SW1 corresponding to all the input ports Pin_1 to Pin_n into an OFF state.

The gain mode is an operation mode which can be selected when signal strength is low and amplification by the amplifier LNA1 is considered necessary. The bypass mode is an operation mode which can be selected when the signal strength is sufficiently high that amplification is not considered necessary. The mode signal Msel designates the gain mode and the bypass mode in accordance with the strength of the signal being received by the receiving circuit R1. As described above, the receiving circuit R1 according to the first embodiment can transmit the received signal over different transmission paths in the gain mode or the bypass mode.

Figure 3:
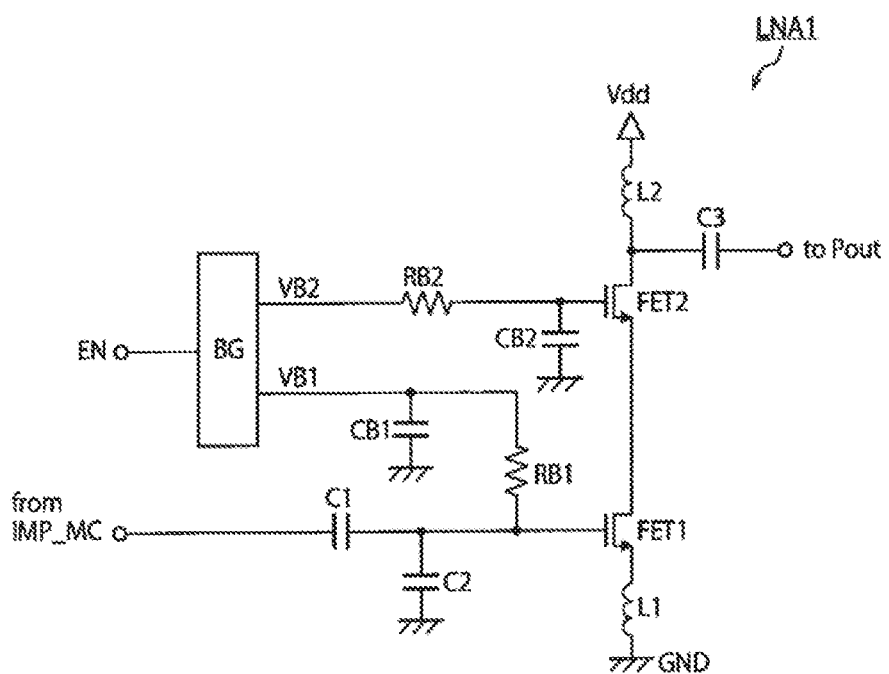
FIG. 3 is a diagram showing a configuration example of an amplification circuit.

FIG. 3 is a diagram showing a configuration example of the amplifier LNA1. The amplifier LNA1 includes N-type metal oxide semiconductor FETs (MOSFETs) FET1 and FET2 (hereinafter simply referred to as FET1 and FET2), inductor elements L1 and L2, capacitor elements C1, C2, C3, CB1, and CB2, resistance elements RB1 and RB2, and a bias voltage generation circuit BG.

FET1 and FET2 are connected to form a cascode amplifier and connected are in series between a power supply Vdd and a ground (a reference voltage source) GND. More specifically, the drain of FET1 is connected to the source of FET2 and the source of FET1 is connected to the ground GND via the inductor element L1. The drain of FET2 is connected to the power supply Vdd via the inductor element L2 and is connected to the output port Pout via the capacitor element C3. The gate of FET1 is connected to the impedance matching circuit IMP_MC via the capacitor element C1 and is connected to the ground GND via the capacitor element C2. Furthermore, the gate of FET1 is also connected to the bias voltage generation circuit BG via the resistance element RB1. The gate of FET2 is connected to the bias voltage generation circuit BG via the resistance element RB2 and is connected to the ground GND via the capacitor element CB2.

The bias voltage generation circuit BG receives an enable signal EN from the control circuit CNT, and applies a voltage VB1 to the gate of FET1 and applies a voltage VB2 to the gate of FET2 to drive (or stop) the amplifier LNA1. For example, in the gain mode, the control circuit CNT sets the enable signal EN at a high level and the bias voltage generation circuit BG sets the voltages VB1 and VB2 at predetermined voltages. As a result, the amplifier LNA1 operates. On the other hand, in the bypass mode, the control circuit CNT sets the enable signal EN at a low level and the bias voltage generation circuit BG sets the voltages VB1 and VB2 at approximately zero. As a result, the amplifier LNA1 stops operating.

The capacitor element C2 and the inductor element L1 are provided to achieve impedance matching with consideration given to the gain and noise of the amplifier LNA1 along with the impedance matching circuit IMP_MC and the first and second switch circuits SW1 and SW2. The inductor element L2 and the capacitor element C3 are provided as an output impedance matching circuit. The capacitor element C1 is provided to cut a direct-current component from the impedance matching circuit IMP_MC. The capacitor elements CB1 and CB2 and the resistance elements RB1 and RB2 are provided to prevent RF signals from the impedance matching circuit IMP_MC from entering the bias voltage generation circuit BG.

Figure 4C:
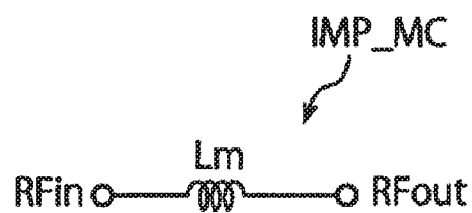

FIGS. 4A to 4C depict configuration examples of the impedance matching circuit IMP_MC. The impedance matching circuit IMP_MC includes an inductor element Lm and a capacitor element Cm. However, in some embodiments, the impedance matching circuit IMP_MC does not include a capacitor element Cm and is formed using only the inductor element Lm. In FIG. 4A, the inductor element Lm is connected between an input terminal RFin and an output terminal RFout and the capacitor element Cm is connected between the output terminal RFout and the ground GND. In FIG. 4B, the capacitor element Cm is connected between the input terminal RFin and the output terminal RFout and the inductor element Lm is connected between the output terminal RFout and the ground GND. In FIG. 4C, the inductor element Lm is connected between the input terminal RFin and the output terminal RFout and the capacitor element Cm is not specifically provided.

Here, the input terminal RFin can be connected to the first switch circuit SW1 (see FIG. 2), and the output terminal RFout can be connected to the amplifier LNA1 (see FIG. 2).

The impedance matching circuit IMP_MC may have any one of the configurations shown in FIGS. 4A to 4C. Incidentally, the impedance matching circuit IMP_MC can be adjusted such that the input impedance is matched to a predetermined value (for example, 50Ω), with consideration also given to the first and second switch circuits SW1 and SW2 and the inductor element L1 and the capacitor element C2 in the amplifier LNA1.

Figure 5:
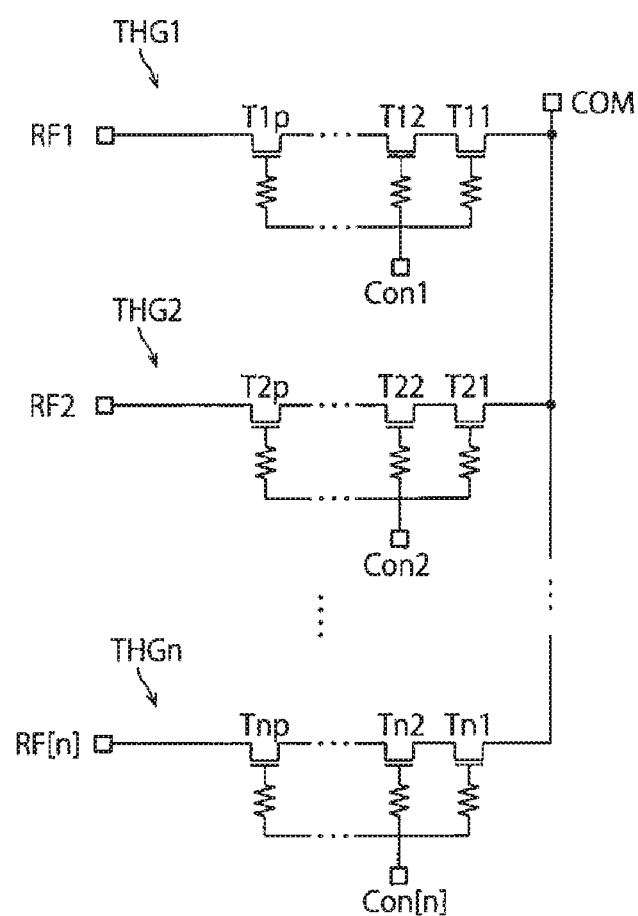
FIG. 5 is a diagram showing a configuration example of a first switch circuit and/or a second switch circuit.

FIG. 5 is a diagram showing a configuration example of the first switch circuit SW1 and/or the second switch circuit SW2. The internal configurations of the first and second switch circuits SW1 and SW2 may be the same. Therefore, only the configuration of the first switch circuit SW1 will be explained here and the explanation of the configuration of the second switch circuit SW2 will be omitted.

The first switch circuit SW1 is a so-called SPnT switch. The first switch circuit SW1 includes through-element groups THG1 to THGn. The through-element groups THG1 to THGn are connected between input-side ports RF1 to RFn, respectively, and a common port COM.

The through-element group THG1 (first through-element group) includes a plurality of through-elements (through-FETs) T11 to T1p (where p is an integer greater than or equal to 1) connected in series. The through-elements T11 to T1p may be MOSFETs, each having the same configuration. The gates of the through-elements T11 to T1p are connected to the control circuit CNT and receive a common control signal Con1. Therefore, the through-elements T11 to T1p are simultaneously controlled by the control signal Con1. As a result, the through-element group THG1 is subjected to ON/OFF control like one switch element.

Likewise, the through-element group THG2 as a second through-element group includes a plurality of through-elements T21 to T2p connected in series. The through-elements T21 to T2p may be MOSFETs having the same configuration. The gates of the through-elements T21 to T2p are connected to the control circuit CNT and receive a common control signal Con2. Therefore, the through-elements T21 to T2p can be simultaneously controlled by the control signal Con2. As a result, the through-element group THG2 is subjected to ON/OFF control like one switch element.

Each of the through-element groups THG3 to THGn similarly includes a plurality of through-elements connected in series and is controlled in a similar manner. As a result, each of the through-element groups THG3 to THGn are also, respectively, controlled ON/OFF like one switch element.

In the first switch circuit SW1, the ports RF1 to RFn would be connected to the input ports Pin_1 to Pin_n, respectively and the common port COM would be connected to the amplifier LNA1 via the impedance matching circuit IMP_MC. Therefore, the through-element group THG1 of the first switch circuit SW1 would be provided between the input port Pin_1 (first input portion) and the amplifier LNA1 and performs switching of the signal between the input port Pin_1 and the amplifier LNA1. The through-element group THG2 of the first switch circuit SW1 is provided between the input port Pin_2 (second input portion) and the amplifier LNA1 and performs switching of the signal between the input port Pin_2 and the amplifier LNA1. Likewise, the through-element groups THG3 to THGn of the first switch circuit SW1 are provided between the input ports Pin_3 to Pin_n, respectively, and the amplifier LNA1, and thus perform switching of the signal between the input ports Pin_3 to Pin_n and the amplifier LNA1.

For the second switch circuit SW2, the ports RF1 to RFn would be connected to the input ports Pin_1 to Pin_n, respectively, and the common port COM would be connected to the output port Pout. Therefore, the through-element group THG1 (a first through-element group) of the second switch circuit SW2 is provided between the input port Pin_1 and the output port Pout and performs switching of the signal between the input port Pin_1 and the output port Pout. The through-element group THG2 (a second through-element group) of the second switch circuit SW2 is provided between the input port Pin_2 and the output port Pout and performs switching of the signal between the input port Pin_2 and the output port Pout. Likewise, the through-element groups THG3 to THGn of the second switch circuit SW2 are provided between the input ports Pin_3 to Pin_n, respectively, and the output port Pout and perform switching of the signal between the input ports Pin_3 to Pin_n and the output port Pout.

FIGS. 6A and 6B are tables for showing the operations of the first and second switch circuits SW1 and SW2. FIG. 6A is a table showing the states of the switch circuits SW1 and SW2 according to the operation mode.

For example, in the gain mode (first mode), the first switch circuit SW1 is in a passing state (conducting state) and the second switch circuit SW2 is in a non-passing state (non-conducting state). Thus, the first switch circuit SW1 selectively connects any one of the input ports Pin_1 to Pin_n to the amplifier LNA1 via the impedance matching circuit IMP_MC and passes the received signal to the impedance matching circuit IMP_MC and the amplifier LNA1. At this time, the second switch circuit SW2 interrupts the RF signals between all the input ports Pin_1 to Pin_n and the output port Pout and does not pass any received signal.

For example, in the bypass mode (second mode), the first switch circuit SW1 is in a non-passing (non-conducting) state and the second switch circuit SW2 is in a passing state (conducting state). In this case, the first switch circuit SW1 interrupts the RF signals between all the input ports Pin_1 to Pin_n and the amplifier LNA1 and does not pass any received signal. At this time, the second switch circuit SW2 selectively connects any one of the input ports Pin_1 to Pin_n to the output port Pout and thus passes the received signal to the output port Pout.

FIG. 6B is a table showing the conducting state of the through-element group corresponding to a selected port or a non-selected port in a passing state and a non-passing state. In the following explanation, the through-element groups of the first switch circuit SW1 are referred to as THG1_1 to THGn_1 and the through-element groups of the second switch circuit SW2 are referred to as THG1_2 to THGn_2.

If the switch circuit SW1 or SW2 is in a passing state, the through-element group corresponding to the selected port (which is selected by the port selection signal Psel) enters an ON state (a conducting state). On the other hand, the through-element group corresponding to the non-selected port (which is not selected by the port selection signal Psel) enters an OFF state (a non-conducting state). If the switch circuit SW1 or SW2 is in a non-passing state, irrespective of the port selection signal Psel, the through-element group enters an OFF state.

For example, in the gain mode, if the input port Pin_1 is the selected port, the control signal Con1 takes a high level Von and the through-element group THG1_1 of the first switch circuit SW1 connected to the input port Pin_1 enters an ON state. The other control signals Con2 to Con(n) remain at a low level Voff and the other through-element groups THG2_1 to THGn_1 of the first switch circuit SW1 enter an OFF state. At this time, since the second switch circuit SW2 is in a non-passing state, all the through-element groups THG1_2 to THGn_2 enter an OFF state.

On the other hand, for example, in the bypass mode, if the input port Pin_2 is the selected port, the control signal Con2 takes a high level Von and the through-element group THG2_2 of the second switch circuit SW2 connected to the input port Pin_2 enters an ON state. The other control signals Con1 and Con3 to Con(n) remain at a low level Voff and the other through-element groups THG1_2 and THG3_2 to THGn_2 of the second switch circuit SW2 enter an OFF state. At this time, since the first switch circuit SW1 is in a non-passing state, all the through-element groups THG1_1 to THGn_1 enter an OFF state. Incidentally, Von is a gate voltage at which the through-FETs of the through-element group are in a conducting state and the ON resistance thereof becomes sufficiently low. Voff is a gate voltage at which the through-FETs of the through-element group enter a non-conducting state and the RF signal can be adequately interrupted.

As described above, the first and second switch circuits SW1 and SW2 can transmit a signal to the amplifier LNA1 or the output port Pout via an arbitrary through-element group in accordance with the mode selection signal Msel and the port selection signal Psel.

Incidentally, the through-element groups THG1 to THGn each comprise series connected through-elements (through-FETs) of p stages. The number p of stages of the through-elements is, in general, determined by the expected magnitude of the electric power associated with the received signal and the breakdown-voltage characteristics of a single through-element. Therefore, the number p of stages may be an integer greater than or equal to 2, or the number p of stages can be 1 in some cases.

As described above, the receiving circuit R1 according to the first embodiment can transmit the received signal over different transmission paths. In the gain mode, the receiving circuit R1 amplifies the received signal from the selected port (via the impedance matching circuit IMP_MC) using the amplifier LNA1 and outputs the resultant amplified signal to output port Pout. As a result, the impedance (the input impedance) from the input port-side of the path of the received signal in the gain mode can be matched to the characteristic impedance (for example, 50Ω) of the receiving circuit system such that the impedance becomes nearly equal to the characteristic impedance.

On the other hand, in the bypass mode, the receiving circuit R1 outputs the signal from the selected port to the output port Pout without amplifying the signal (or passing it through the impedance matching circuit IMP_MC). As a result, the input impedance of the path of the received signal in the bypass mode can become nearly equal to the characteristic impedance (for example, 50Ω) of the receiving circuit system, if the resistance value observed when the second switch circuit SW2 is ON is sufficiently low. As a result, in the receiving circuit R1 according to the first embodiment, a difference in input impedance between the gain mode and the bypass mode can be reduced. Consequently, the receiving circuit R1 can achieve impedance matching of the RF signal while making the gain variable in both operation modes: the gain mode and the bypass mode.

Moreover, in the first embodiment, the FETs constituting the amplifier LNA1 can be formed on an SOI (semiconductor-on-insulator) substrate. The SOI substrate includes a supporting substrate, an insulating layer on the supporting substrate, and a semiconductor layer on the insulating layer. The various circuit elements such as the amplifier LNA1 are provided on the semiconductor layer. As a result, the radio-frequency (RF) characteristics of the amplifier LNA1 can be improved since the parasitic capacitance of the amplifier LNA1 becomes smaller. On the other hand, if the parasitic capacitance of the amplifier LNA1 is small, the input impedance of the amplifier LNA1 generally becomes higher.

Therefore, when the amplifier LNA1 is formed on a SOI substrate, applying the receiving circuit according to the first embodiment is advantageous because this facilitates impedance matching. Moreover, the higher resistivity (for example, 1 kΩcm or higher) of the supporting substrate in the SOI substrate is preferable because insertion loss and isolation characteristics of the switch circuits SW1 and SW2 can be improved by making the resistivity of the supporting substrate higher.

Furthermore, the receiving circuit R1 according to the first embodiment turns off the amplifier LNA1 when in the bypass mode. Therefore, power consumption of the receiving circuit R1 can be reduced when the strength of the received signal is sufficiently high.

(Regarding Insertion Loss)

Next, the insertion loss (IL) between input port Pin_n of the receiving circuit R1 and amplifier LNA1 will be explained. In general, the insertion loss (IL) of the multiport switch such as an SPnT switch depends on the frequency of the received signal and is mainly determined by the ON resistance $R_{on}$ and the OFF capacitance $C_{off}$ of the through-element groups connected to the input ports Pin_1 to Pin_n. Expression 1 is an approximate expression for the insertion loss (IL) (in dB).

$$IL = |10 \log_{10}\{(1+R_{on}/2Z_0)^2 + [(Z_0+R_{on})/2X_C]^2\}| \qquad (1)$$

$$X_C = 1/(2\pi \cdot f \cdot C_{off}) \qquad (2)$$

where $R_{on}$ is the ON resistance of the through-element groups while in an ON state, $C_{off}$ is the sum total of the capacitance of the through-element groups in an OFF state, $Z_0$ is the characteristic impedance of the system of the receiving circuit R1 and is, for example, 50Ω and f is the frequency of the received signal.

For example, ON resistance $R_{on\_}G$ in the gain mode is the ON resistance of the ON state through-element group that is connected to the selected port in the first switch circuit SW1 (for example, the through-element group THG1_1). OFF capacitance $C_{off\_G}$ in the gain mode is the total OFF capacitance of the OFF state through-element groups that are connected to the non-selected ports in the first switch circuit SW1 (for example, the through-element groups THG2_1 to THGn_1) and to the selected port in the second switch circuit SW2 (for example, the through-element group THG1_2). The ON resistance $R_{on\_}G$ in the gain mode is expressed by Expression 3. The OFF capacitance $C_{off\_}G$ in the gain mode is expressed by Expression 4.

$$R_{on\_}G = p1 \cdot R_{on}0/Wg1 \qquad (3)$$

$$C_{off\_}G = (n1-1) \cdot C_{off}0 \cdot Wg1/p1 + C_{off}0 \cdot Wg2/p2 \qquad (4)$$

where, p1 is the number of (the number of stages of) through-FETs included in each of the through-element groups THG1_1 to THGn_1 of the first switch circuit SW1, p2 is the number of (the number of stages of) through-FETs included in each of the through-element groups THG1_2 to THGn_2 of the second switch circuit SW2, $R_{on}0$ (ohm-mm) and $C_{off}0$ (F/mm) are ON resistance and OFF capacitance per unit length (unit gate width) of the through-FET respectively, Wg1 and Wg2 are the gate widths of the through-FETs of the first and second switch circuits SW1 and SW2 respectively, and n1 (n1≥2) is the number of input ports of the first switch circuit SW1. In Expression 4, the first term on the right side represents the OFF capacitance of the OFF state through-element groups (for example, THG2_1 to THGn_1) in the first switch circuit SW1. The second term on the right side represents the OFF capacitance of the OFF state through-element group (for example, THG1_2) in the second switch circuit SW2.

From Expressions 1 to 4, the insertion loss (IL) of the first and second switch circuits SW1 and SW2 in the gain mode can be obtained simply by substituting $R_{on\_G}$ and $C_{off\_G}$ of Expressions 3 and 4 into $R_{on}$ and $C_{off}$ of Expressions 1 and 2. As is clear from those described above, reducing $R_{on\_G}$ and $C_{off\_G}$ is preferable to reduce the insertion loss (IL) in the gain mode.

Moreover, the noise figure $NF_{total}$ (units of dB) of the whole receiving circuit R1 in the gain mode is determined by the sum of the insertion loss (IL) (units of dB) between the input port Pin_n and the amplifier LNA1 and the noise figure $NF_{LNA}$ (units of dB) of the amplifier LNA1. Therefore, to reduce the noise figure $NF_{total}$ of the whole receiving circuit R1 in the gain mode, reducing the insertion loss (IL) between the input port Pin_n and the amplifier LNA1 is effective. Incidentally, since the insertion loss of the impedance matching circuit IMP_MC can be reduced by appropriately selecting the circuit elements forming the impedance matching circuit IMP_MC, the influence thereof on the insertion loss between Pin_n and LNA1 can be ignored.

Thus, to reduce the insertion loss between the input port Pin_n and the amplifier LNA1 in the gain mode, first, minimizing $R_{on\_G}$ is preferable. Here, the product $R_{on} \cdot C_{off}$ of the through-FETs is generally determined by the FET structure and is a fixed value for a given FET structure. Therefore, if the ON resistance $R_{on\_G}$ of the first switch circuit SW1 in the gain mode is reduced, the OFF capacitance of the first switch circuit SW1 increases. That is, if the ON resistance of the through-element groups THG1_1 to THGn_1 which may be selected in the gain mode is reduced, the OFF capacitance of each through-element groups THG1_1 to THGn_1 increases. If the OFF capacitance of the first switch circuit SW1 increases, the first term on the right side of Expression 4 increases, which results in an increase in the OFF capacitance $C_{off\_G}$ in the gain mode. Based on Expressions 1 and 2, an increase in the OFF capacitance $C_{off\_G}$ also leads to an increase in the insertion loss (IL). For example, an increase in the OFF capacitance $C_{off\_G}$ increases the insertion loss in a high frequency band.

Thus, next, to reduce an increase in the OFF capacitance $C_{off\_G}$ as much as possible, the second term on the right side of Expression 4 is reduced as much as possible. That is, the OFF capacitance of the second switch circuit SW2 is reduced. By reducing the OFF capacitance of the second switch circuit SW2, the OFF capacitance $C_{off\_G}$ is reduced, whereby the insertion loss between the input port Pin_n and the amplifier LNA1 in the gain mode can be reduced. That is, in the first embodiment, by reducing the ON resistance $R_{on\_G}$ of the first switch circuit SW1 and the OFF capacitance of the second switch circuit SW2 in the gain mode, the insertion loss between the input port Pin_n and the amplifier LNA1 is reduced.

For example, in the first embodiment, settings are such that at least the second term on the right side of Expression 4 becomes smaller than or equal to the first term. In such a case, Expression 5 can be established.

$$(Wg2/p2)/(Wg1/p1) \leq (n1-1) \quad (5)$$

In case of n1=2, if the number p1 of stages of the through-FETs in the first switch circuit SW1 and the number p2 of stages of the through-FETs in the second switch circuit SW2 are equal, the gate width Wg2 of the through-FETs constituting the second switch circuit SW2 simply has to be set so as to be smaller than the gate width Wg1 of the through-FETs constituting the first switch circuit SW1. Alternatively, if the gate width Wg1 and the gate width Wg2 are equal, the number p1 of stages of the through-FETs in the first switch circuit SW1 simply has to be set so as to be smaller than the number p2 of stages of the through-FETs in the second switch circuit SW2.

On the other hand, since the product $R_{on} \cdot C_{off}$ of the second switch circuit SW2 is fixed, if the OFF capacitance of the second switch circuit SW2 is reduced, the ON resistance of the second switch circuit SW2 increases. As a result, the insertion loss between the input port Pin_n and the output port Pout in the bypass mode increases. However, in the bypass mode, since the receiving circuit R1 is processing a signal having a relatively high signal strength, a certain level of insertion loss between the input port Pin_n and the output port Pout in the bypass mode can be tolerated without serious problem. It is desirable rather to transmit the signal having relatively low strength, such that amplification is required, with a low insertion loss in the gain mode.

Furthermore, according to the first embodiment, since the second switch circuit SW2 is connected to the output port Pout, the amplified signal which is output from the output port Pout in the gain mode is applied to the SW2. Therefore, the second switch circuit SW2 has to be capable of interrupting higher power than the first switch circuit SW1. The interrupting capability (breakdown voltage) of a switch is determined by the number of stages of the through-FETs and the breakdown-voltage characteristics of each through-FET. Therefore, if the first and second switch circuits SW1 and SW2 are assumed to be formed of through-FETs having the same design, then setting the number p2 of stages of the through-FETs forming each through-element group of the second switch circuit SW2 so as to be greater than the number p1 (p2>p1) of stages of the through-FETs forming each through-element group of the first switch circuit SW1 is preferable.

Incidentally, if the insertion loss between the input port Pin_n and the amplifier LNA1 in the gain mode is reduced, since the product $R_{on} \cdot C_{off}$ is fixed, the insertion loss between the input port Pin_n and the output port Pout in the bypass mode increases. In this case, there is a concern that proper matching of the input impedance of the receiving circuit R1 cannot be achieved in the bypass mode. In such a case, a trade-off between the insertion loss in the gain mode and impedance matching in the bypass mode has to be considered; however, a determination as to whether a higher priority is to be given to the insertion loss or impedance matching has to be made depending on the actual use case expected during operation.

Second Embodiment

Figure 7:
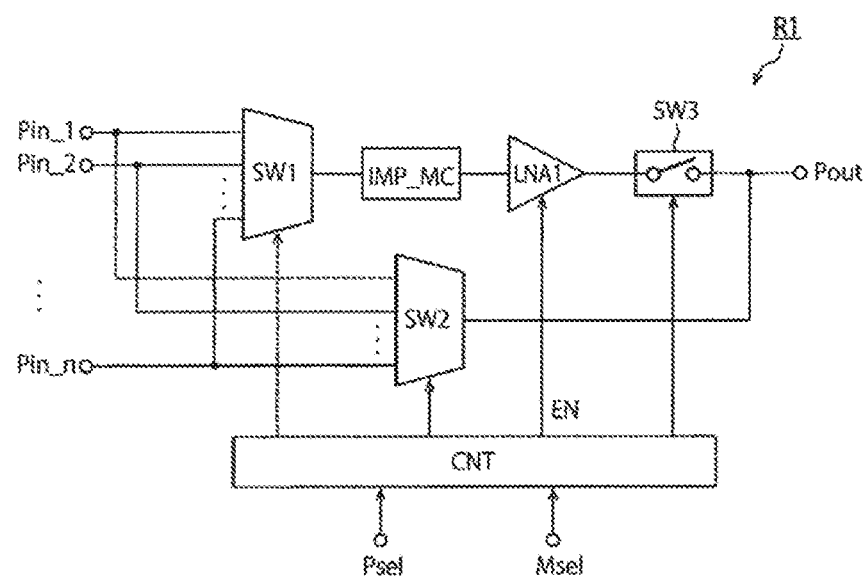
FIG. 7 is a diagram showing the configuration of a receiving circuit according to a second embodiment.

FIG. 7 is a diagram showing the configuration of a receiving circuit R1 according to a second embodiment. The configuration of receiving circuits R2 to R4 may be similar to receiving circuit R1. In some embodiments, the receiving circuits R1 to R4 may each be a receiving circuit in FIG. 2 or the receiving circuit in FIG. 7.

As compared to the receiving circuit R1 of the first embodiment, the receiving circuit R1 according to the second embodiment further includes a third switch circuit SW3 provided between the amplifier LNA1 and the output port Pout. The third switch circuit SW3 as a third switch portion connects the amplifier LNA1 and the output port Pout in the gain mode and cuts off the amplifier LNA1 from the output port Pout when in the bypass mode. The control circuit CNT further controls the third switch circuit SW3.

The other configurations of the receiving circuit R1 in the second embodiment may be similar to the corresponding configurations of the receiving circuit R1 according to the first embodiment.

Figure 8:
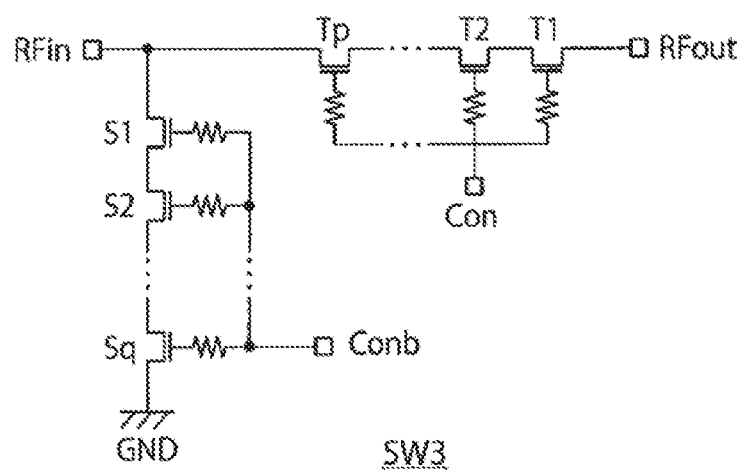
FIG. 8 is a diagram showing a configuration example of a third switch circuit.

FIG. 8 is a diagram showing a configuration example of the third switch circuit SW3. The third switch circuit SW3 includes through-elements T1 to Tp and shunt elements S1 to Sq (p and q are integers greater than or equal to 1). The through-elements T1 to Tp are connected in series between the ports RFin and RFout and function as through-FETs. The shunt elements S1 to Sq are connected in series between the port RFin and ground GND and function as shunt FETs. Here, the port RFin would be connected to the output of the amplifier LNA1 and the port RFout would be connected to the output port Pout.

The gates of the through-elements T1 to Tp are connected to the control circuit CNT and receive a common control signal Con. Therefore, the through-elements T1 to Tp are controlled simultaneously. As a result, the through-elements T1 to Tp are subjected to ON/OFF control like one switch.

The gates of the shunt elements S1 to Sq are connected to the control circuit CNT and receive a common control signal Conb. Therefore, the shunt elements S1 to Sq are controlled simultaneously. As a result, the shunt elements S1 to Sq are subjected to ON/OFF control like one switch.

The control signals Con and Conb are signals which are complementary to each other (e.g., high/low logic or low/high logic). Therefore, when the through-elements T1 to Tp are in a conducting state, the shunt elements S1 to Sq are in a non-conducting state. When the through-elements T1 to Tp are in a non-conducting state, the shunt elements S1 to Sq are in a conducting state. The voltage levels of the control signals Con and Conb may be similar to the voltage levels (a high level Von, a low level Voff) of the control signals Con1 to Con(n) in the first embodiment.

Figures 9, 10:
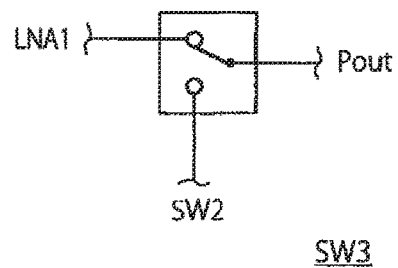
FIG. 9 is a table for explaining the operation of the third switch circuit.
FIG. 10 is a diagram showing another configuration example of the third switch circuit.

FIG. 9 is a table showing the operation of the third switch circuit SW3. For example, when in the gain mode, the through-elements T1 to Tp are in a conducting state (an ON state) and the shunt elements S1 to Sq are in a non-conducting state (an OFF state). In this case, the third switch circuit SW3 passes the signal from the amplifier LNA1 to the output port Pout. At this time, since the shunt elements S1 to Sq are in an OFF state, the shunt elements S1 to Sq do not affect the passage of the output signal of the amplifier LNA1 to the output port Pout.

When in the bypass mode, the through-elements T1 to Tp are in a non-conducting state (an OFF state) and the shunt elements S1 to Sq are in a conducting state (an ON state). When in the bypass mode, the received signal is transmitted to the output port Pout via the second switch circuit SW2. Therefore, as a result of the through-elements T1 to Tp being in an OFF state, the third switch circuit SW3 does not allow the signal from the output port Pout to leak back into the amplifier LNA1. Moreover, since the shunt elements S1 to Sq operate to shunt the port RFin to the ground GND, leakage of the received signal from the output port Pout to the amplifier LNA1 can be reduced more effectively. That is, the third switch circuit SW3 can improve the isolation between the amplifier LNA1 and the output port Pout when the receiving circuit R1 of this second embodiment is operated in the bypass mode.

Furthermore, according to the second embodiment, the third switch circuit SW3 separates the amplifier LNA1 from the second switch circuit SW2 and the output port Pout during the bypass mode. As a result, impedance matching in the bypass mode can be achieved without consideration of the influence of the amplifier LNA1. Consequently, impedance matching in the bypass mode is achieved more easily.

In general, the number p of through-elements T1 to Tp and the number q of through-elements S1 to Sq are determined by the strength of signal power and the breakdown-voltage characteristics of the through-FETs or shunt FETs. Therefore, although p and q are typically integers greater than or equal to 2, in some cases p and q can be 1.

Moreover, if sufficient isolation can be achieved with just the use of the through-elements T1 to Tp, the shunt elements S1 to Sq do not necessarily have to be provided in all embodiments.

Additionally, the third switch circuit SW3 shown in FIG. 7 may be the switch circuit shown in FIG. 10. FIG. 10 shows another configuration example for the third switch circuit SW3. The third switch circuit SW3 shown in FIG. 10 is a single-pole dual-throw (SPDT) switch that connects the output port Pout to one of the amplifier LNA1 and the second switch circuit SW2. The third switch circuit SW3 shown in FIG. 10 can be obtained by connecting the two switches, each having a configuration as shown in FIG. 8, such that one is connected between the amplifier LNA1 and the output port Pout and the other is connected between the second switch circuit SW2 and the output port Pout. By complementarily controlling these two switches, the third switch circuit SW3 shows in FIG. 10 can be formed as an SPDT switch.

Third Embodiment

Figure 11:
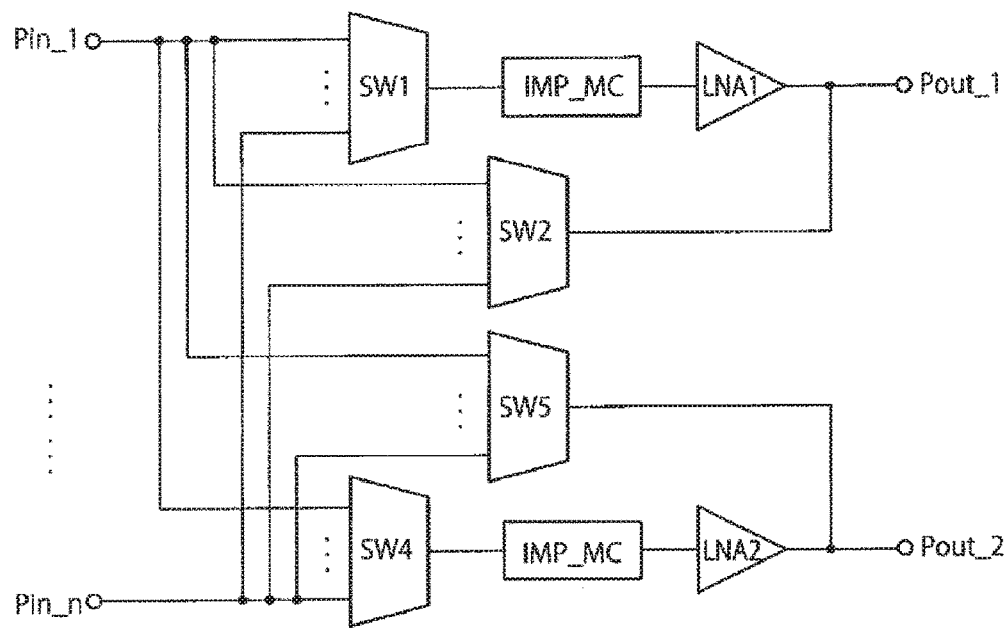
FIG. 11 is a diagram showing a configuration example of receiving circuits according to a third embodiment.

FIG. 11 is a diagram showing the configuration of a receiving circuit according to a third embodiment.

The receiving circuit according to the third embodiment is a receiving circuit supporting so-called carrier aggregation (CA), which allows signals in different frequency bands to be received at the same time.

The receiving circuit according to the third embodiment can amplify two received signals in different frequency bands, or cause these two signals to bypass the impedance matching circuit and the amplification circuit. The receiving circuit according to the third embodiment can output amplified signals or bypassed signals to either an output port Pout_1 or an output port (second output portion) Pout_2.

The receiving circuit of the third embodiment is controlled by a control circuit CNT, not shown in FIG. 11 (see FIG. 2 for this element).

The receiving circuit according to the third embodiment can support so-called carrier aggregation (CA), so as to permit signals in different frequency bands to be received and processed at the same time.

Fourth Embodiment

Figure 12:
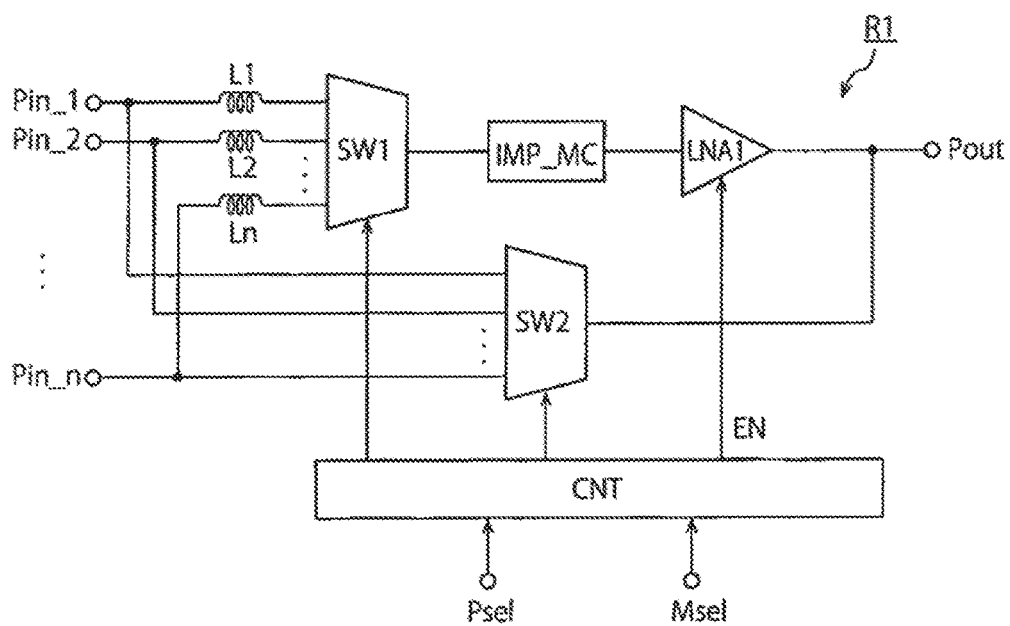
FIG. 12 is a diagram showing the configuration of a receiving circuit according to a fourth embodiment.

FIG. 12 is a diagram showing the configuration of a receiving circuit R1 according to a fourth embodiment. The configurations of receiving circuits R2 to R4 may be similar to the configuration of the receiving circuit R1.

As compared the first embodiment, the receiving circuit R1 of the fourth embodiment further includes inductor elements L1 to Ln connected between the input ports Pin_1 to Pin_n and the first switch circuit SW1. The other configurations of the receiving circuit R1 according to the fourth embodiment is similar to the corresponding configurations of the receiving circuit R1 according to the first embodiment.

These inductor elements L1 to Ln are provided for input impedance matching along with the impedance matching circuit IMP_MC and the impedance matching elements (L1 and C2 in FIG. 3) in the amplifier LNA1. Therefore, each of the inductor elements L1 to Ln do not necessarily have to be provided for each port, and the inductor elements L1 to Ln can be provided only for those input ports requiring additional impedance matching adjustments.

The gain characteristics and NF characteristics of the amplifier LNA1 vary depending on inductance value. Moreover, the optimum inductance value varies depending on the frequency of the received signal. Therefore, in the fourth embodiment, the inductor elements L1 to Ln may be set to have inductance values specifically corresponding to the frequencies of the signals corresponding to each of the input ports Pin_1 to Pin_n. As a result, the receiving circuit R1 according to the fourth embodiment can have improved gain characteristics and NF characteristics.

Fifth Embodiment

Figure 13:
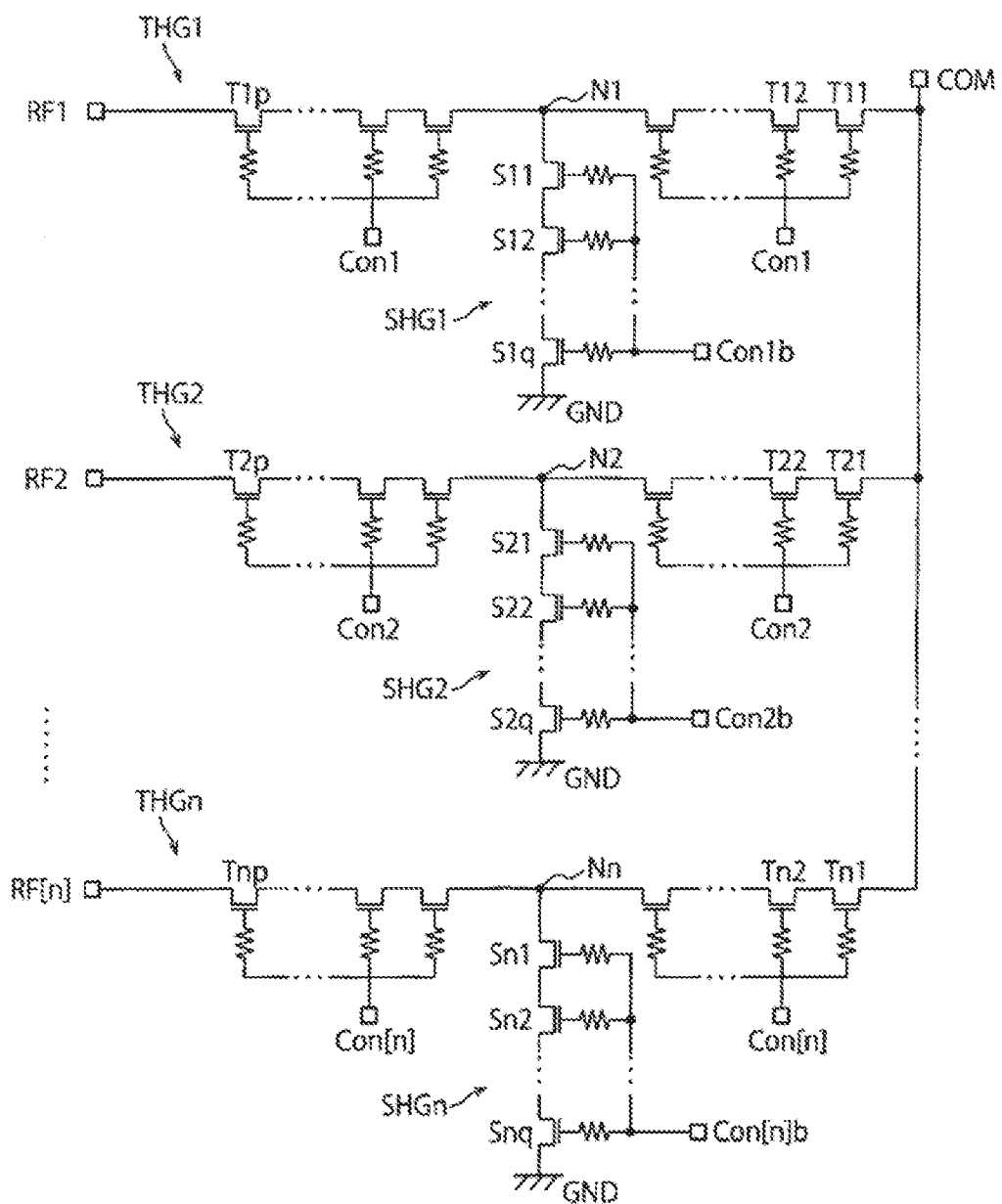
FIG. 13 is a diagram showing a configuration example of a first switch circuit and/or a second switch circuit according to a fifth embodiment.

FIG. 13 is a diagram showing a configuration example of a first switch circuit SW1 and/or a second switch circuit SW2 according to a fifth embodiment. The configurations of the first and second switch circuits SW1 and SW2 may be the same in some embodiments. Therefore, only the configuration of the first switch circuit SW1 will be explained here and separate explanation of the configuration of the second switch circuit SW2 will be omitted. Either or both of the first and second switch circuits SW1 and SW2 may have the configuration shown in FIG. 13 or, alternatively, one or both of the first and second switch circuits SW1 and SW2 may have the configuration shown in FIG. 5. In some embodiments, one of the first and second switch circuits SW1 and SW2 may have the configuration shown in FIG. 13 and the other may have the configuration shown in FIG. 5.

The first switch circuit SW1 according to the fifth embodiment differs from the first switch circuit SW1 in the first embodiment in that shunt element groups SHG1 to SHGn are connected at some midpoint (node) in the through-element groups THG1 to THGn, respectively. The other configurations in the fifth embodiment may otherwise be similar to the corresponding configurations in the first embodiment.

The shunt element groups SHG1 to SHGn are respectively connected between nodes N1 to Nn located at some midpoint in the through-element groups THG1 to THGn, respectively, and the ground GND. For example, the first shunt element group SHG1 includes a plurality of shunt elements (shunt FETs) S11 to S1$q$ connected in series between the node N1 and the ground GND. The node N1 is any node between the plurality of through-elements T11 to T1$p$ of the first through-element group THG1. The gates of the shunt elements S11 to S1$q$ are connected to the control circuit CNT and receive a common control signal Con1$b$. Therefore, the shunt elements S11 to S1$q$ are under the same control of the control signal Con1$b$ at the same time. As a result, the shunt element group SHG1 is simultaneously subjected to ON/OFF control like one switch.

For example, the second shunt element group SHG2 includes a plurality of shunt elements (shunt FETs) S21 to S2$q$ connected in series between the node N2 and the ground GND. The node N2 (second node) is any node between the through-elements T21 to T2$p$ in the second through-element group THG2. The gates of the shunt elements S21 to S2$q$ are connected to the control circuit CNT and receive a common control signal Con2$b$. Therefore, the shunt elements S21 to S2$q$ are controlled by the control signal Con2$b$ at the same time. As a result, the shunt element group SHG2 is subjected to ON/OFF control like one switch.

The shunt element groups SHG3 to SHGn are configured in a similar manner. The shunt element groups SHG3 to SHGn are connected to the through-element groups THG3 to THGn at the third to n-th nodes, respectively.

The control signals Con1$b$ to Con(n)$b$ are complementary signals of the control signals Con1 to Con(n). Therefore, the through-element group and the shunt element group operate in a complementary manner.

FIGS. 14A and 14B are tables showing the operations of the first and second switch circuits SW1 and SW2 according to the fifth embodiment. FIG. 14A is the same as FIG. 6A. FIG. 14B is obtained by adding the ON/OFF state of the shunt element group (the shunt FETs) to the table in FIG. 6B.

Hereinafter, to differentiate between the through-element groups of the first switch circuit SW1 and the through-element groups of the second switch circuit SW2, the through-element groups of the first switch circuit SW1 are referred to as THG1_1 to THGn_1 and the through-element groups of the second switch circuit SW2 are referred to as THG1_2 to THGn_2. The shunt element groups of the first switch circuit SW1 are referred to as SHG1_1 to SHGn_1 and the shunt element groups of the second switch circuit SW2 are referred to as SHG1_2 to SHGn_2.

If the switch circuit SW1 or SW2 is in a passing state, the through-element group corresponding to the selected port enters an ON state and the shunt element group corresponding to the selected port enters an OFF state. On the other hand, the through-element group corresponding to the non-selected port enters an OFF state and the shunt element group corresponding to the non-selected port enters an ON state. If the switch circuit SW1 or SW2 is in a non-passing state, the through-element group enters an OFF state and the shunt element group enters an ON state irrespective of the port selection signal Psel.

For example, if the input port Pin_1 is the selected port for the gain mode, the control signal Con1 takes a high level Von and the through-element group THG1_1 of the first switch circuit SW1 connected to the input port Pin_1 enters an ON state. At this time, the control signal Con1$b$ takes a low level Voff and the shunt element group SHG1_1 of the first switch circuit SW1 enters an OFF state.

Since the other control signals Con2 to Con(n) of the first switch circuit SW1 remain at a low level Voff, the other through-element groups THG2_1 to THGn_1 of the first switch circuit SW1 enter an OFF state. At this time, since the second switch circuit SW2 is in a non-passing state, all the through-element groups THG1_2 to THGn_2 enter an OFF state. On the other hand, the control signals Con2$b$ to Con(n)$b$ of the first switch circuit SW1 take a high level Von and the shunt element groups SHG2_1 to SHGn_1 enter an ON state. At this time, since the second switch circuit SW2 is in a non-passing state, all the shunt element groups SHG1_2 to SHGn_2 enter an ON state.

For example, if the input port Pin_2 is the selected port in the bypass mode, the control signal Con2 takes a high level Von and the through-element group THG2_2 of the second switch circuit SW2 connected to the input port Pin_2 enters an ON state. At this time, the control signal Con2$b$ takes a low level Voff and the shunt element group SHG2_2 of the second switch circuit SW2 connected to the input port Pin_2 enters an OFF state.

The other control signals Con1 and Con3 to Con(n) of the second switch circuit SW2 remain at a low level Voff and the other through-element groups THG1_2 and THG3_2 to THGn_2 of the second switch circuit SW2 enter an OFF state. At this time, since the first switch circuit SW1 is in a non-passing state, all the through-element groups THG1_1 to THGn_1 enter an OFF state. On the other hand, the control signals Con1b and Con3b to Con(n)b of the second switch circuit SW2 take a high level Von and the shunt element groups SHG1_2 and SHG3_2 to SHGn_2 enter an ON state. At this time, since the first switch circuit SW1 is in a non-passing state, all the shunt element groups SHG1_1 to SHGn_1 enter an ON state.

As described above, in the gain mode or the bypass mode, when the through-element group corresponding to the non-selected port interrupts (blocks) the received signal, the shunt element group corresponding thereto enters an ON state. As a result, the shunt element group shunts the through-element group corresponding to the non-selected port to the ground GND whereby any signals (spurious signals) which might leak between the non-selected port and the common port COM can be reduced. As a result, the shunt element group can improve the isolation characteristics between the non-selected port and the common port COM.

The first shunt element group SHG1 is connected to the node N1 at some midpoint in the first through-element group THG1. That is, at least one through-element is provided between the port RF1 and the node N1 and at least one other through-element is provided between the node N1 and the amplifier LNA1. The same goes for the shunt element groups SHG2 to SHGn. As a result, the leakage of signal to the non-selected port side from the common port COM can be reduced. Consequently, the influence on the through-element group THG1 corresponding to the selected port RF1 that passes the received signal becomes smaller, which can facilitate impedance matching of the through-element group THG1 corresponding to the selected port.

Furthermore, the amount of leakage of the input signal from the selected port to the second switch circuit SW2 in the case of the gain mode and to the first switch circuit SW1 in the case of the bypass mode can be reduced compared to the amount in the first embodiment. As a result, the interference between the signal path in the gain mode and the signal path in the bypass mode becomes smaller, which can facilitate impedance matching in the gain mode and the bypass mode.

In addition, a design with the size (the gate width) of the shunt elements S11 to S1q being smaller than the size of the through-elements T11 to T1p is preferable. That is, the OFF capacitance of the shunt elements S11 to S1q is made smaller than the OFF capacitance of the through-elements T11 to T1p. The reason is as follows: by making the OFF capacitance of the shunt elements S11 to S1q smaller than the OFF capacitance of the through-elements T11 to T1p, the shunt elements S11 to S1q affect the signal insignificant when the through-elements T11 to T1p pass the received signal.

If the configuration in FIG. 13 is applied to the second switch circuit SW2, the second switch circuit SW2 can prevent backflow of the amplified signal to the input ports Pin_1 to Pin_n from the output port Pout in the gain mode since the isolation characteristics are good. That is, the second switch circuit SW2 according to the fifth embodiment can improve the reverse isolation characteristics. As a result, unstable operation of the amplifier LNA1 can be prevented.

Incidentally, the number p of through-elements connected in series in any one through-element group and the number q of shunt elements connected in series in any one shunt element group are determined by the magnitude of the electric power of the received signal and the breakdown-voltage characteristics of a single FET. Therefore, p and q may be integers greater than or equal to 2, but p and q could be 1 in some cases.

The other configurations in the fifth embodiment may be considered to be similar to the corresponding configurations of the first embodiment. Therefore, the fifth embodiment also has the advantages of the first embodiment. Moreover, the fifth embodiment may be combined with any other embodiment.

Sixth Embodiment

Figure 15:
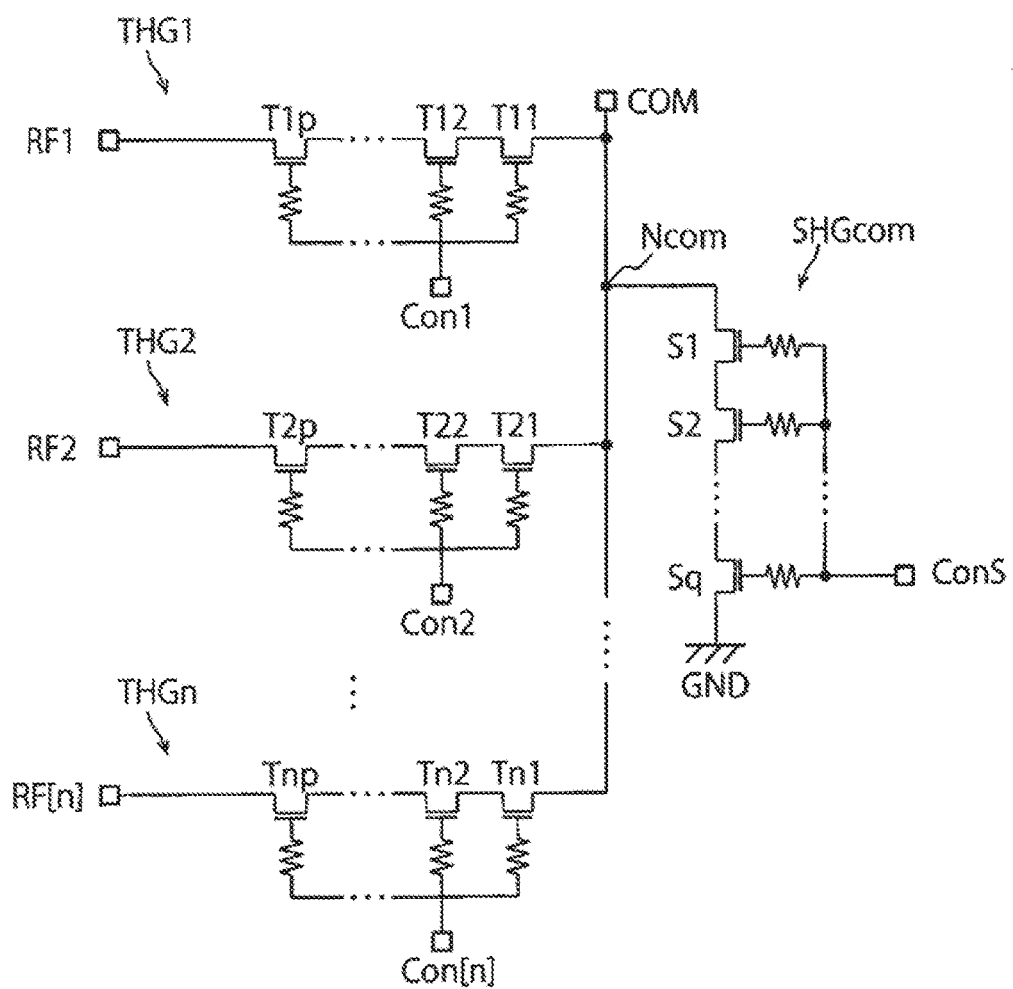
FIG. 15 is a diagram showing a configuration example of a first switch circuit and/or a second switch circuit according to a sixth embodiment.

FIG. 15 is a diagram showing a configuration example of a first switch circuit SW1 or a second switch circuit SW2 according to a sixth embodiment. The configurations of the first and second switch circuits SW1 and SW2 may be the same or different. Only the configuration of the first switch circuit SW1 will be explained, but in some embodiments the second switch circuit SW2 may have the same configuration as the first switch circuit SW1 and thus separate explanation of the configuration of the second switch circuit SW2 can be omitted. In some embodiments, one of the first and second switch circuits SW1 and SW2 may have the configuration shown in FIG. 15 and the other may have one of the configurations shown in FIG. 5 or 13.

The first switch circuit SW1 according to the sixth embodiment differs from the first embodiment in that a shunt element group SHGcom, shared by all the through-element groups THG1 to THGn, is connected to the common port COM. The shunt element group SHGcom includes a plurality of shunt elements S1 to Sq connected in series between the Ncom positioned between the first switch circuit SW1 and the amplifier LNA1, and the ground GND.

The gates of the shunt element group SHGcom are connected to the control circuit CNT and simultaneously receive a control signal ConS. As a result, the shunt element group SHGcom is subjected to ON/OFF control as one switch. The other configurations in the sixth embodiment may be considered similar to the corresponding configurations of the first embodiment.

If the switch circuit shown in FIG. 15 is applied to the second switch circuit SW2, a third switch SW3 that cuts off the second switch circuit SW2 from the output port Pout in the gain mode is necessary. The third switch SW3 may be the third switch circuit SW3 as shown in FIG. 10. In this case, the plurality of shunt elements S1 to Sq of the shunt element group SHGcom are connected in series between a node positioned between the second switch circuit SW2 and the output port Pout, and the ground GND. As described above, the switch circuit shown in FIG. 15 can be applied to one or both of the first and second switch circuits SW1 and SW2.

If the second switch circuit SW2 is connected to the output port Pout in the gain mode, the shunt element group SHGcom affects the output matching characteristics of the amplifier LNA1 and desired amplification characteristics cannot be obtained.

On the other hand, by providing the third switch SW3, the second switch circuit SW2 is cut off from the output port Pout in the gain mode. As a result, backflow of the received signal from the amplifier LNA1 to the second switch circuit SW2 can be prevented. That is, the third switch circuit SW3 can improve the reverse isolation characteristics in the gain mode. Moreover, the influence of SW2 on the LNA amplification characteristics can be prevented.

FIGS. 16A and 16B are tables showing the operations of the first and second switch circuits SW1 and SW2 according to the sixth embodiment. FIG. 16A is the same as FIG. 6A. FIG. 16B is obtained by adding the ON/OFF state of the shunt element group SHGcom to the table in FIG. 6B.

The control signal ConS is subjected to ON/OFF control based on the passing/non-passing state of the first and second switch circuits SW1 and SW2. For example, in the gain mode, the first switch circuit SW1 is in a passing state, the control signal ConS of the first switch circuit SW1 takes a low level Voff. As a result, the shunt element group SHGcom of the first switch circuit SW1 enters an OFF state. At this time, since the second switch circuit SW2 enters a non-passing state, the control signal ConS of the second switch circuit SW2 takes a high level Von. As a result, the shunt element group SHGcom of the second switch circuit SW2 enters an ON state.

On the other hand, in the bypass mode, the second switch circuit SW2 is in a passing state, the control signal ConS of the second switch circuit SW2 takes a low level Voff. As a result, the shunt element group SHGcom of the second switch circuit SW2 enters an OFF state. At this time, since the first switch circuit SW1 enters a non-passing state, the control signal ConS of the first switch circuit SW1 takes a high level Von. As a result, the shunt element group SHGcom of the first switch circuit SW1 enters an ON state. The third switch circuit SW3 is connected to the side of the amplifier LNA1 in the gain mode and is connected to the side of the second switch circuit SW2 in the bypass mode.

As described above, according to the sixth embodiment, in the gain mode or the bypass mode, the shunt element group SHGcom of one switch circuit SW1 (or SW2) in a non-passing state shunts the common port COM to the ground GND. In the switch circuit SW1 (or SW2) in a non-passing state, the shunt element group SHGcom can reduce a signal (spurious) which is about to leak between the port RF1 and the common port COM. As a result, when the switch circuit SW1 (or SW2) interrupts the received signal, the shunt element group SHGcom can improve the isolation characteristics between the input ports RF1 to RFn and the common port COM, which leads to prevention of an increase in the insertion loss of the other switch circuit SW2 (or SW1) in a passing state.

Moreover, the amount of leakage of the input signal from the selected port to the side of the second switch circuit SW2 in the case of the gain mode and to the side of the first switch circuit SW1 in the case of the bypass mode can be reduced compared to the amount in the first embodiment. As a result, the interference between the signal path in the gain mode and the signal path in the bypass mode becomes smaller, which can facilitate impedance matching in the gain mode and the bypass mode.

Furthermore, one shunt element group SHGcom is provided in each of the first and second switch circuits SW1 and SW2 as a common shunt element group SHGcom. Therefore, the size of the receiving circuit R1 according to the sixth embodiment can be smaller than the size of the receiving circuit R1 according to the fifth embodiment.

As is the case with the shunt elements S11 to S1$q$ in the fifth embodiment, making the size (the gate width) of the shunt elements S1 to Sq smaller than the size of the through-elements T11 to T1$p$ and so forth is preferable. By doing so, when the through-elements T11 to T1$p$ and so forth pass the received signal, the shunt elements S1 to Sq affect the received signal insignificantly.

The other configurations in the sixth embodiment may be considered similar to the corresponding configurations in the first embodiment. Therefore, the sixth embodiment also has the effect of the first embodiment. Moreover, the sixth embodiment may be combined with any other embodiment.

Seventh Embodiment

Figure 17:
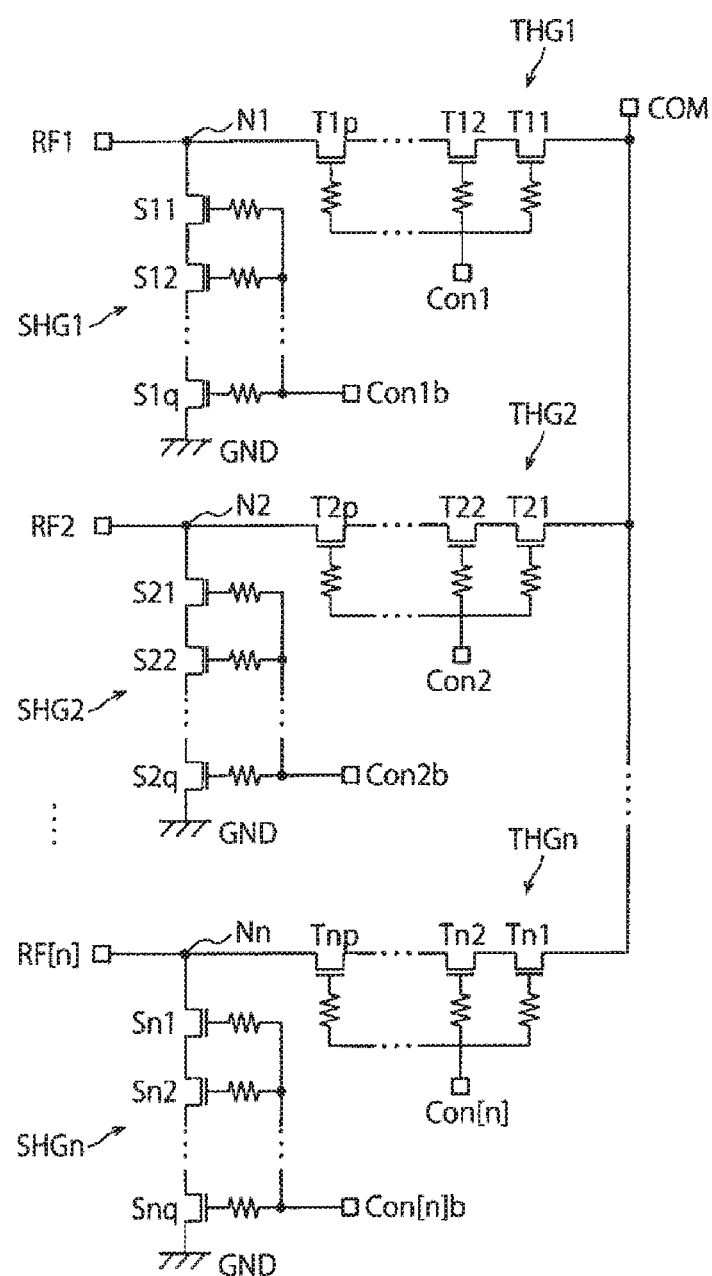
FIG. 17 is a diagram showing a configuration example of a first switch circuit or a second switch circuit according to a seventh embodiment.

FIG. 17 is a diagram showing a configuration example of a first switch circuit SW1 or a second switch circuit SW2 according to a seventh embodiment. The configurations of the first and second switch circuits SW1 and SW2 may be the same as or different from each other. One of the first and second switch circuits SW1 and SW2 may have the configuration shown in FIG. 17 and the other may have the configuration shown in FIG. 5, 13, or 15.

The first switch circuit SW1 according to the seventh embodiment differs from the fifth embodiment in that the shunt element groups SHG1 to SHGn are connected to the ends of the through-element groups THG1 to THGn on the side where the ports RF1 to RF(n) are located. The other configurations in the seventh embodiment may be similar to the corresponding configurations in the fifth embodiment.

The shunt element groups SHG1 to SHGn are connected between nodes N1 to Nn of the through-element groups THG1 to THGn on the side where the ports RF1 to RF(n) are located, respectively, and the ground GND. For example, the first shunt element group SHG1 includes a plurality of shunt elements S11 to S1$q$ connected in series between the node N1 and the ground GND. The node N1 is a node between the first through-element group THG1 and the port RF1. The gates of the shunt elements S11 to S1$q$ are connected to the control circuit CNT and receive a common control signal Con1$b$. Therefore, the shunt elements S11 to S1$q$ are under the control of the same control signal Con1$b$. As a result, the shunt element group SHG1 is subjected to ON/OFF control as one switch.

For example, the second shunt element group SHG2 includes a plurality of shunt elements S21 to S2$q$ connected in series between the node N2 and the ground GND. The node N2 is provided between the second through-element group THG2 and the port RF2. The gates of the shunt elements S21 to S2$q$ are connected to the control circuit CNT and receive a common control signal Con2$b$. Therefore, the shunt elements S21 to S2$q$ are under the control of the control signal Con2$b$ at the same time. As a result, the shunt element group SHG2 is subjected to ON/OFF control as one switch. The same goes for the shunt element groups SHG3 to SHGn.

FIGS. 18A and 18B are tables showing the operations of the first and second switch circuits SW1 and SW2 according to the seventh embodiment. FIG. 18A is the same as FIG. 14A. FIG. 18B differs from the table in FIG. 14B in the ON/OFF state of the shunt element group (the shunt FETs) in a non-passing state. The control signals Con1$b$ to Con(n)$b$ are basically complementary signals of the control signals Con1 to Con(n). However, if the switch circuit SW1 or SW2 is in a non-passing state, the control signals Con1$b$ to Con(n)$b$ make the shunt element group corresponding to the selected port enter an OFF state and the shunt element group corresponding to the non-selected port enter an ON state.

For example, if the switch circuit SW1 or SW2 is in a passing state, the through-element group corresponding to the selected port enters an ON state and the shunt element group corresponding to the selected port enters an OFF state. On the other hand, the through-element group corresponding to the non-selected port enters an OFF state and the shunt element group corresponding to the non-selected port enters an ON state.

If the switch circuit SW1 or SW2 is in a non-passing state, the through-element group enters an OFF state regardless of the port selection signal Psel. However, the shunt element group enters an ON/OFF state depending on the port selection signal Psel. That is, as in the case where the switch circuit SW1 or SW2 is in a passing state, the shunt element group corresponding to the selected port enters an OFF state and the shunt element group corresponding to the non-selected port enters an ON state.

For example, in the gain mode, if the input port Pin_1 is the selected port, the control signal Con1 takes a high level Von and the through-element group THG1_1 of the first switch circuit SW1 connected to the input port Pin_1 enters an ON state. At this time, the control signal Con1$b$ takes a low level Voff and the shunt element group SHG1_1 of the first switch circuit SW1 enters an OFF state.

The other control signals Con2 to Con(n) of the first switch circuit SW1 remain at a low level Voff and the other through-element groups THG2_1 to THGn_1 of the first switch circuit SW1 enter an OFF state. At this time, since the second switch circuit SW2 is in a non-passing state, all the through-element groups THG1_2 to THGn_2 enter an OFF state. On the other hand, the control signals Con2$b$ to Con(n)$b$ of the first switch circuit SW1 take a high level Von and the other shunt element groups SHG2_1 to SHGn_1 of the first switch circuit SW1 enter an ON state. At this time, the control signal Con1$b$ of the second switch circuit SW2 takes a low level Voff and the control signals Con2$b$ to Con(n)$b$ of the second switch circuit SW2 take a high level Von. As a result, the shunt element group SHG1_2 of the second switch circuit SW2 is in an OFF state and the other shunt element groups SHG2_2 to SHGn_2 enter an ON state.

For example, if the input port Pin_2 is the selected port in the bypass mode, the control signal Con2 takes a high level Von and the through-element group THG2_2 of the second switch circuit SW2 connected to the input port Pin_2 enters an ON state. At this time, the control signal Con2$b$ takes a low level Voff and the shunt element group SHG2_2 of the second switch circuit SW2 connected to the input port Pin_2 enters an OFF state.

The other control signals Con1 and Con3 to Con(n) of the second switch circuit SW2 remain at a low level Voff and the other through-element groups THG1_2 and THG3_2 to THGn_2 of the second switch circuit SW2 enter an OFF state. At this time, since the first switch circuit SW1 is in a non-passing state, all the through-element groups THG1_1 to THGn_1 enter an OFF state. On the other hand, the control signals Con1$b$ and Con3$b$ to Con(n)$b$ of the second switch circuit SW2 take a high level Von and the other shunt element groups SHG1_2 and SHG3_2 to SHGn_2 of the second switch circuit SW2 enter an ON state. At this time, the control signal Con2$b$ of the first switch circuit SW1 takes a low level Voff and the control signals Con1$b$ and Con3$b$ to Con(n)$b$ of the first switch circuit SW1 take a high level Von. As a result, the shunt element group SHG2_1 of the first switch circuit SW1 is in an OFF state and the other shunt element groups SHG1_1 and SHG3_1 to SHGn_1 enter an ON state.

As described above, in the gain mode or the bypass mode, when the through-element group corresponding to the non-selected port interrupts (blocks) the received signal, the shunt element group corresponding thereto enters an ON state. As a result, the shunt element group shunts the node of the through-element group to the ground GND and thereby can reduce a signal (spurious) which might leak between the non-selected port and the common port COM. Consequently, the shunt element group can improve the isolation characteristics between the non-selected port and the common port COM, which prevents an increase in the insertion loss of the through-element group corresponding to the selected port. The seventh embodiment operates in a manner similar to the fifth embodiment.

However, in the seventh embodiment, even when the switch circuits SW1 and SW2 are in a non-passing state, the shunt element group corresponding to the selected port enters an OFF state and the shunt element group corresponding to the non-selected port enters an ON state. The reason will be described below.

Here, the switch circuits SW1 and SW2 share the input ports Pin_1 to Pin_n. Moreover, in the seventh embodiment, no through-element is provided between the input ports Pin_1 to Pin_n and the shunt element groups. Therefore, if the shunt element group corresponding to the selected port is in an ON state when the switch circuit SW2 is in a non-passing state, the received signal is connected to the ground GND via the shunt element group. In this case, in the other switch circuit SW1 which is in a passing state, there is a concern that the received signal that passes through the through-element group corresponding to the selected port is degraded.

However, in the seventh embodiment, when the switch circuit SW2 is in a non-passing state, the shunt element group of the switch circuit SW2 corresponding to the selected port enters an OFF state and the input impedance thereof becomes high. In this case, degradation of the received signal that passes through the through-element group corresponding to the selected port can be prevented in the switch circuit SW1 in a passing state.

The number p of through-elements connected in series in a certain through-element group and the number q of shunt elements connected in series in a certain shunt element group are determined by the magnitude of the electric power of the received signal and the breakdown-voltage characteristics of a single FET. Therefore, p and q may be integers greater than or equal to 2, but p and q can also be 1 in some cases.

The seventh embodiment may be combined with any embodiment other than the fifth embodiment.

Eighth Embodiment

Figure 19:
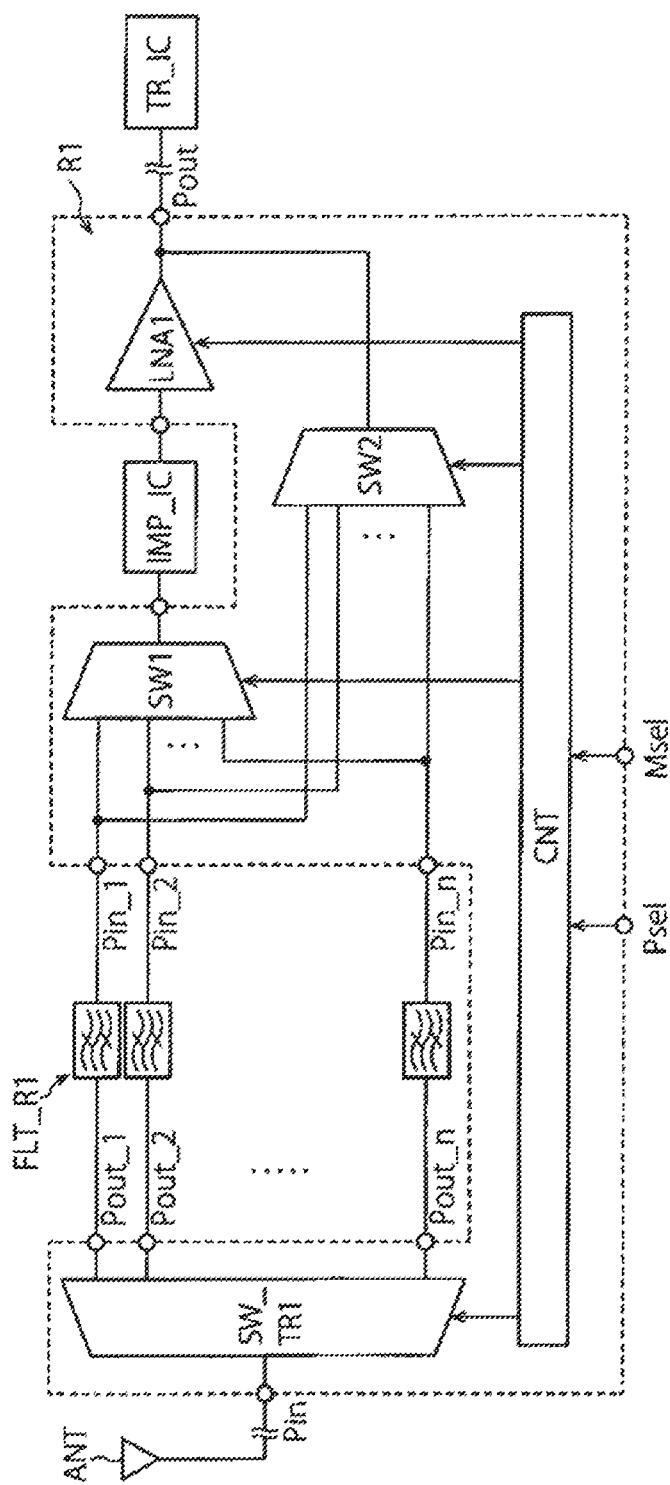
FIG. 19 is a diagram showing a configuration example of a wireless communication module according to an eighth embodiment.

FIG. 19 is a diagram showing a configuration example of a wireless communication module according to an eighth embodiment. The wireless communication module includes, in one module, an amplifier LNA1, a first switch circuit SW1, a second switch circuit SW2, a switch circuit SW_TR1, a control circuit CNT, an impedance matching circuit IMP_MC, and a filter circuit (a band-pass filter (BPF)) FLT_R1. Of the wireless communication module (hereinafter also referred to simply as a module), the amplifier LNA1, the first switch circuit SW1, the second switch circuit SW2, the switch circuit SW_TR1, and the control circuit CNT, which are in a frame indicated by a broken line, are formed on the same semiconductor substrate (for example, a semiconductor-on-insulator (SOI) substrate) and is configured as one, integrated semiconductor chip.

Here, the impedance matching circuit IMP_MC and the filter circuit (the band-pass filter (BPF)) FLT_R1 are formed separately from the above-described semiconductor chip and then integrated with the semiconductor chip into one module or package. As a result, the wireless communication module performs selection of a frequency band of a received signal corresponding to each of the input ports Pin_1 to Pin_n and impedance matching. By integrating the above-described component elements into one module, the wireless communication device can be made smaller.

Moreover, the switch circuit SW_TR1 is provided on the same SOI substrate along with the switch circuits SW1 and SW2. As described above, by forming the switch circuits SW1, SW2, and SW_TR1 and the control circuit CNT as one chip, the wireless communication device can be made smaller. Incidentally, the amplifier LNA1, the switch circuits SW1 and SW2, and the control circuit CNT may have the same configurations as their respective corresponding configurations in the above-described embodiments.

The switch circuit SW_TR1 outputs the RF signal received by the antenna ANT1 to any one of the input ports Pout_1 to Pout_n (shown in FIG. 2) based on the port selection signal Psel. The filter circuit FLT_R1 extracts, from the RF signals that passed through the switch circuit SW_TR1, a received signal of a desired frequency and blocks other spurious signals. Then, the received signal is transmitted to the switch circuits SW1 and SW2 and so forth. The operations of the switch circuits SW1 and SW2, the impedance matching circuit IMP_MC, and the amplifier LNA1 are as those as explained in the above-described embodiments.

To the switch circuit SW_TR1, signals other than the desired received signal are also input. For instance, transmitted signals from the transmitting circuits T1 and T2 and RF signals which are output from other wireless systems such as WiFi are sometimes input to the switch circuit SW_TR1. The power levels of these signals which might be output from the same device or nearby systems are often very high compared to a desired power level of the received signal. Therefore, the switch circuit SW_TR1 has to block high power signals as compared to the switch circuits SW1 and SW2.

The switch circuit SW_TR1 may have basically the same configuration as the configuration of the switch circuits SW1 and SW2. However, to make the breakdown-voltage characteristics of the switch circuit SW_TR1 better than the breakdown-voltage characteristics of the switch circuits SW1 and SW2, setting the number p of stages of through-elements (through-FETs) of the switch circuit SW_TR1 so as to be greater than or equal to the number p of stages in the switch circuits SW1 and SW2 is typically preferable. Moreover, similarly, if the switch circuit SW_TR1 has a shunt element group, setting the number q of stages of shunt elements (shunt FETs) of the switch circuit SW_TR1 so as to be greater than or equal to the number q of stages in the switch circuits SW1 and SW2 is typically preferable.

The module can be applied to a front-end module for transmission and reception and a front-end module for reception. However, the present embodiment may be directly mounted in a high-frequency transmitting and receiving portion in a communication device. Moreover, some functions of the module may be implemented in the module itself and other functions may be implemented directly in the high-frequency transmitting and receiving portion.

While certain specific embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the example embodiments described herein may be made without departing from the spirit of the disclosure. The accompanying claims and their equivalents are intended to cover such forms or modifications as would fall within the scope and spirit of the disclosure.

What is claimed is:

1. A receiving circuit, comprising:
a plurality of input nodes that are configured to receive an input signal;
an output node that is configured to output an output signal corresponding to the input signal;
an amplifier having an input terminal and an output terminal, the output terminal being connected to the output node;
a first switch connected to the plurality of input nodes and configured to selectively connect each one of the input nodes in the plurality of input nodes to the input terminal of the amplifier;
a second switch connected to the plurality of input nodes and configured to selectively connect each one of the input nodes in the plurality of input nodes to the output node via a path bypassing the first switch and the amplifier;
a controller configured to supply control signals to the first switch and the second switch; and
an impedance matching section connected between the plurality of input nodes and the amplifier, wherein
the first switch comprises:
a first through-element group including a plurality of transistors connected in series; and
a second through-element group including a plurality of transistors connected in series, wherein:
the first through-element group is connected between a first input node in the plurality of input nodes and the amplifier, and
the second through-element group is connected between a second input node in the plurality of input nodes and the amplifier; and
the second switch comprises:
a third through-element group including a plurality of transistors connected in series; and
a fourth through-element group including a plurality of transistors connected in series, wherein:
the third through-element group is connected between the first input node in the plurality of input nodes and the output node, and
the fourth through-element group is connected between the second input node in the plurality of input nodes and the output node.

2. The receiving circuit according to claim 1, wherein the impedance matching section is connected between the first switch and the amplifier.

3. The receiving circuit according to claim 1, wherein the transistors included in the first, second, third, and fourth through-element groups satisfy:

$$(Wg2/p2)/(Wg1/p1) \le (n1-1),$$

where n1 is the number of the input nodes in the plurality of the input nodes and is greater than 2, Wg1 is the gate width of the transistors included in the first and second through-element groups, Wg2 is the gate width of the transistors included in the third and fourth through-element groups, p1 is the number of transistors included in each of the first and second through-element groups, and p2 is the number of transistors included in each of the third and fourth through-element groups.

4. The receiving circuit according to claim 1, wherein:
a number of transistors included in each of the third and fourth through-element groups is greater than or equal to a number of transistors included in each of the first and second through-element groups.

5. The receiving circuit according to claim 1, wherein the first switch further comprises:
a first shunt element group including a plurality of transistors connected in series between a reference voltage node and a node at one end of the first through-element group or between the transistors of the first through-element group, and
a second shunt element group including a plurality of transistors connected in series between the reference voltage node and a node at one end of the second through-element group or between the transistors of the second through-element group.

6. The receiving circuit according to claim 1, wherein the second switch further comprises:
a first shunt element group including a plurality of transistors connected in series between the reference voltage node and a node at one end of the third through-element group or between the transistors of the third through-element group, and
a second shunt element group including a plurality of transistors connected in series between the reference voltage node and a node at one end of the fourth through-element group or between the transistors of the fourth through-element group.

7. The receiving circuit according to claim 1, further comprising at least one of:
a first shunt element group including a plurality of transistors connected in series between a reference voltage node and a node between the first switch and the input terminal of the amplifier; and
a second shunt element group including a plurality of transistors connected in series between the reference voltage node and a node between the second switch and the output node.

8. The receiving circuit according to claim 1, further comprising:
a third switch connected between the output terminal of the amplifier and the output node, wherein
the controller is further configured to supply a control signal to the third switch.

9. The receiving circuit according to claim 1, wherein:
the controller is configured to supply control signals to the first switch and the second switch according to a port selection control signal and a mode selection control signal,
in a first mode selected according to the mode selection control signal, the controller supplies control signals to the first switch to cause the first switch to connect one input node in the plurality of input nodes to the input terminal of the amplifier, the one input node being selected according to the port selection control signal, and the controller supplies control signals to the second switch to cause the second switch to cut off signal transmission pathways through the second switch from the plurality of input nodes to the output node, and
in a second mode selected according to the mode selection control signal, the controller supplies control signals to the second switch to cause the second switch to connect one input node of the plurality of input nodes to the output node, the one input node being selected according to the port selection control signal, and the controller supplies control signals to the first switch to cause the first switch to cut off signal transmission pathways through the first switch from the plurality of input nodes to the input terminal of the amplifier.

10. The receiving circuit according to claim 9, further comprising:
a third switch connected between the output terminal of the amplifier and the output node, wherein
the controller is further configured to control the third switch to connect the output terminal of the amplifier to the output node in the first mode and to disconnect the output terminal of the amplifier from the output node in the second mode.

11. The receiving circuit according to claim 1, wherein the amplifier, the first switch, and the second switch are formed on a semiconductor-on-insulator substrate.

12. A communication device, comprising:
a first antenna node connectable to a first antenna;
a second antenna node connectable to a second antenna;
a first transceiver circuit connected to the first antenna node and configured to transmit and receive signals, the first transceiver including a first receiving circuit; and
a first receiver circuit connected to the second antenna node and configured to receive signals, the first receiver circuit including a second receiving circuit;
wherein
at least one of the first and second receiving circuits comprises:
a plurality of input nodes that are configured to receive an input signal;
an output node that is configured to output an output signal corresponding to the input signal;
an amplifier having an input terminal and an output terminal connected to the output node;
a first switch connected to the plurality of input nodes and configured to selectively connect each one of the input nodes in the plurality of input nodes to the input terminal of the amplifier;
a second switch connected to the plurality of input nodes and configured to selectively connect each one of the input nodes in the plurality of input nodes to the output node via a path bypassing the first switch and the amplifier;
a controller configured to supply control signals to the first switch and the second switch; and
an impedance matching section connected between the plurality of input nodes and the amplifier, wherein
the first switch comprises:
a first through-element group including a first plurality of transistors connected in series; and
a second through-element group including a second plurality of transistors connected in series, wherein:
the first through-element group is connected between a first input node in the plurality of input nodes and the amplifier, and
the second through-element group is connected between a second input node in the plurality of input nodes and the amplifier; and
the second switch comprises:
a third through-element group including a third plurality of transistors connected in series; and
a fourth through-element group including a fourth plurality of transistors connected in series, wherein
the third through-element group is connected between the first input node and the output node, and
the fourth through-element group is connected between the second input node and the output node.

13. The wireless communication device according to claim 12, wherein the at least one of the first and second receiving circuits, further comprises:

a third switch connected between the output terminal of the amplifier and the output node, wherein the controller is further configured to supply a control signal to the third switch.

14. The wireless communication device according to claim 12, wherein:

a number of transistors included in each of the third and fourth through-element groups is greater than or equal to a number of transistors included in each of the first and second through-element groups.

15. A wireless communication device, comprising:

a receiving circuit that comprises:

a plurality of input nodes that are configured to receive an input signal;

an output node that is configured to output an output signal corresponding to the input signal;

an amplifier having an input terminal and an output terminal, the output terminal being connected to the output node;

a first switch connected to the plurality of input nodes and configured to selectively connect each one of the input nodes in the plurality of nodes to the input terminal of the amplifier;

a second switch connected to the plurality of input nodes and configured to selectively connect each one of the input nodes in the plurality of input nodes to the output node via a path bypassing the first switch and the amplifier;

a controller configured to supply control signals to the first switch and the second switch; and an impedance matching section connected between the plurality of input nodes and the amplifier, wherein the first switch comprises:

a first through-element group including a first plurality of transistors connected in series; and a second through-element group including a second plurality of transistors connected in series, wherein:

the first through-element group is connected between a first input node in the plurality of input nodes and the amplifier, and the second through-element group is connected between a second input node in the plurality of input nodes and the amplifier; and the second switch comprises:

a third through-element group including a third plurality of transistors connected in series; and a fourth through-element group including a fourth plurality of transistors connected in series, wherein:

the third through-element group is connected between the first input node and the output node, and the fourth through-element group is connected between the second input node and the output node.

16. The wireless communication device according to claim 15, wherein:

a number of transistors included in each of the third and fourth through-element groups is greater than or equal to a number of transistors included in each of the first and second through-element groups.

17. The wireless communication device according to claim 15, wherein the receiving circuit, further comprises:

a third switch connected between the output terminal of the amplifier and the output node, wherein the controller is further configured to supply a control signal to the third switch.

* * * * *